United States Patent
Kobayashi et al.

(10) Patent No.: US 8,177,995 B2
(45) Date of Patent: May 15, 2012

(54) PEROVSKITE OXIDE, PROCESS FOR PRODUCING THE PEROVSKITE OXIDE, AND PIEZOELECTRIC DEVICE

(75) Inventors: Hiroyuki Kobayashi, Kanagawa-ken (JP); Yukio Sakashita, Kanagawa-ken (JP)

(73) Assignee: Fujifilm Corporation, Tokyo (JP)

( * ) Notice: Subject to any disclaimer, the term of this patent is extended or adjusted under 35 U.S.C. 154(b) by 503 days.

(21) Appl. No.: 12/403,116

(22) Filed: Mar. 12, 2009

(65) Prior Publication Data

US 2009/0230211 A1 Sep. 17, 2009

(30) Foreign Application Priority Data

Mar. 12, 2008 (JP) ................................. 2008-062129

(51) Int. Cl.
*C04B 35/462* (2006.01)
*H01L 27/20* (2006.01)
(52) U.S. Cl. ............ 252/62.9 R; 252/62.9 PZ; 501/134; 501/135; 501/126; 310/311; 239/102.2
(58) Field of Classification Search ............ 252/62.9 R, 252/62.9 PZ; 501/134, 135, 126; 310/311; 239/102.2
See application file for complete search history.

(56) References Cited

U.S. PATENT DOCUMENTS 7,918,542 B2 * 4/2011 Sakashita et al. ............... 347/68

FOREIGN PATENT DOCUMENTS

| EP | 1901361 | * | 3/2008 |
| JP | 2006-36578 A | | 2/2006 |
| JP | 2007-116091 A | | 5/2007 |
| WO | WO-2007/034903 A1 | | 3/2007 |

OTHER PUBLICATIONS

Yokoyama et al., "Compositional Dependence of Electrical Properties of Highly (100)-/(001)-Oriented Pb(Zr,Ti)O$_3$ Thick Films Prepared on Si Substrates by Metalorganic Chemical Vapor Deposition", Japanese Journal of Applied Physics, vol. 42, 2003, pp. 5922-5926.
"Landolt-Bernstein: Numeral Data and Function Relationships in Science and Technology, New Series", Group III: Crystal and Solid State Physics, vol. 16, 1981, p. 426, Fig. 728.
R.D. Shannon., "Revised Effective Ionic Radii and Systematic Studies of Interatomic Distances in Halides and Chalcogenides", Acta Crystallographica, A32, 1976, pp. 751-767.
Park et al., "Ultrahigh strain and piezoelectric behavior in relaxor based ferroeletric single crystals", Journal of Applied Physics, vol. 82, No. 4, Aug. 15, 1997, pp. 1804-1811.

* cited by examiner

*Primary Examiner* — Carol M Koslow
(74) *Attorney, Agent, or Firm* — Birch, Stewart, Kolasch & Birch, LLP

(57) ABSTRACT

A process for producing a piezoelectric oxide having a composition (Ba, Bi, A)(Ti, Fe, M)O$_3$, where each of A and M represents one or more metal elements. The composition is determined so as to satisfy the conditions (1) and (2), $$0.98 \leq TF(P) \leq 1.02, \quad (1)$$

$$TF(BiFeO_3) < TF(AMO_3) < TF(BaTiO_3), \quad (2)$$

where TF(P) is the tolerance factor of the perovskite oxide, and TF(BaTiO$_3$), TF(BiFeO$_3$), and TF(AMO$_3$) are respectively the tolerance factors of the oxides BaTiO$_3$, BiFeO$_3$, and AMO$_3$.

22 Claims, 11 Drawing Sheets

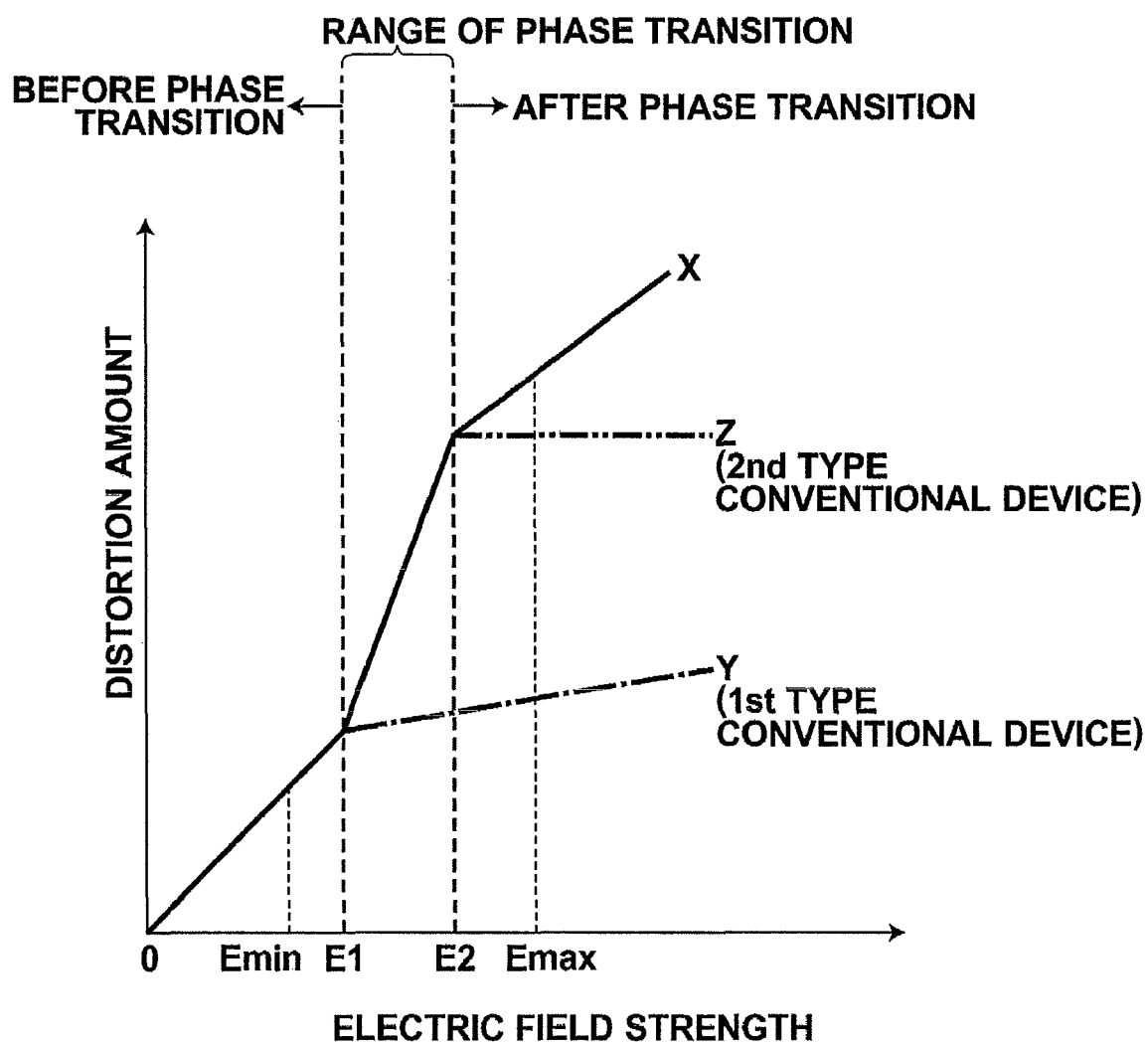

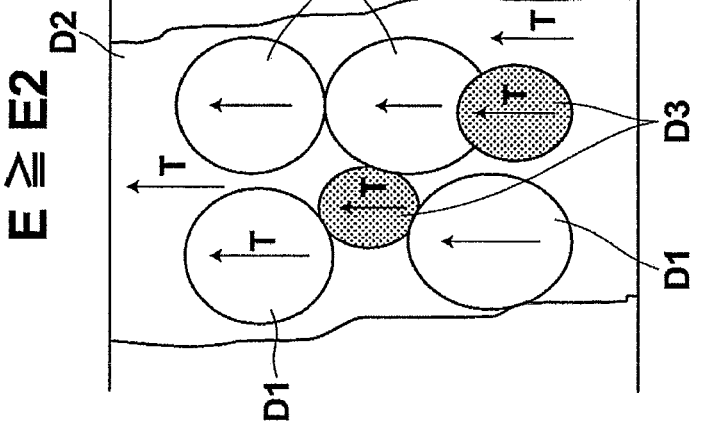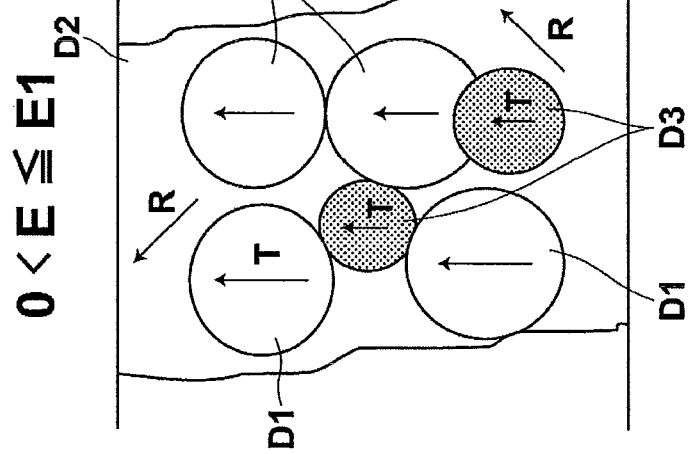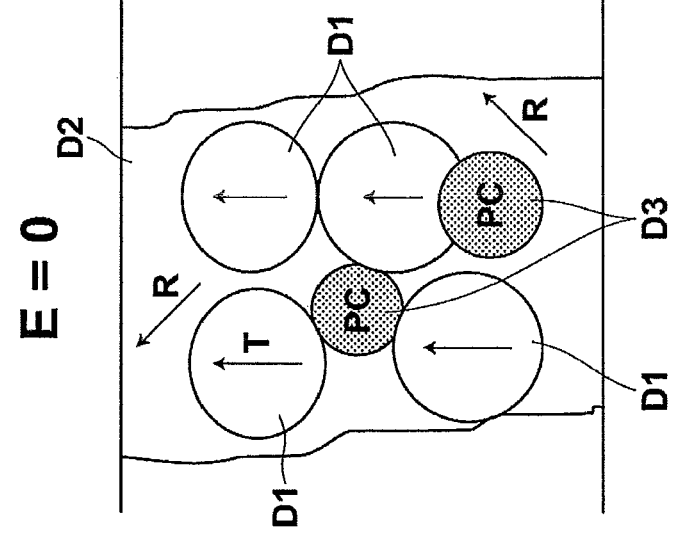

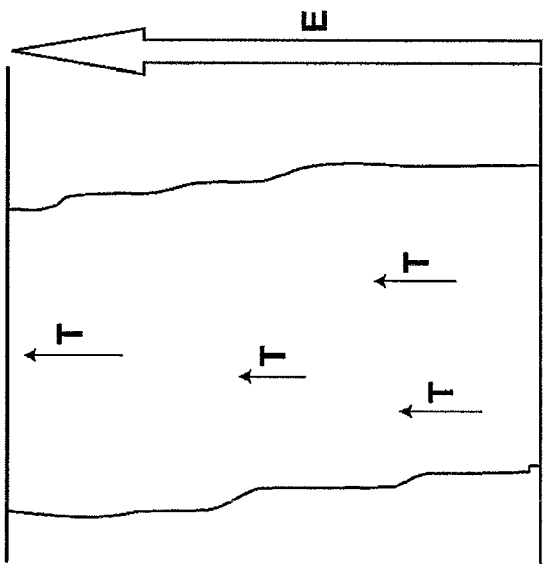
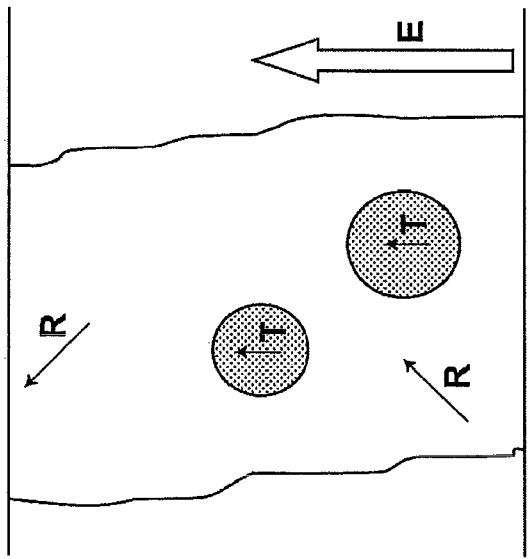
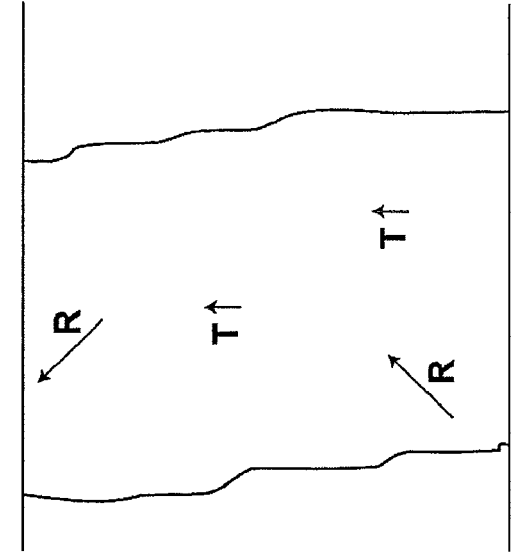

PEROVSKITE OXIDE, PROCESS FOR PRODUCING THE PEROVSKITE OXIDE, AND PIEZOELECTRIC DEVICE

BACKGROUND OF THE INVENTION

1. Field of the Invention

The present invention relates to a perovskite oxide, a process for producing the perovskite oxide, a ferroelectric compound containing the perovskite oxide, a piezoelectric body, a piezoelectric device using the piezoelectric body, and a liquid discharge device using the piezoelectric body.

2. Description of the Related Art

Currently, piezoelectric devices constituted by a piezoelectric body and electrodes are used as, for example, actuators installed in inkjet recording heads. In the piezoelectric devices, the piezoelectric body expands and contracts according to increase and decrease in the strength of an electric field applied from the electrodes to the piezoelectric body in a predetermined direction. For example, perovskite oxides such as PZT (lead titanate zirconate) are known as materials suitable for the piezoelectric body. Such materials are ferroelectric materials which exhibit spontaneous polarization even when no electric field is applied. The piezoelectric materials are reported to exhibit high piezoelectric performance at and near the morphotropic phase boundary (MPB).

PZT is a solid solution of $PbTiO_3$ (PT) and $PbZrO_3$ (PZ). FIG. 12 is a phase diagram of PZT with respect to the temperature and the mole fraction of titanium (i.e., the mole fraction of $PbTiO_3$) in PZT. The phase diagram of FIG. 12 is cited from "Landolt-Bernstein: Numeral Data and Function Relationships in Science and Technology, New Series," Group III: Crystal and Solid State Physics, Vol. 16, edited by K. H. Hellwege and A. M. Hellwege, Springer-Verlag Berlin-Heidelberg-New York, 1981, p. 426, FIG. 728. In FIG. 12, $F_T$ denotes the tetragonal phase, and $F_R$ denotes the rhombohedral phase.

PZT tends to form tetragonal crystals when the Ti composition is high, and rhombohedral crystals when the Zr composition is high. When the molar compositions of Ti and Zr are approximately identical, the MPB composition is achieved. For example, the mole ratio of Zr to Ti of 52/48, which is near to the MPB composition, is preferable. The textbooks on the piezoelectric ceramic materials teach that the crystal structures become unstable and the piezoelectric performance becomes highest at and near the MPB. Conventionally, PZT has been reported to form pseudocubic crystals at and near the MPB. However, details of the nanostructure of PZT are unknown.

In the above circumstances, the Japanese Unexamined Patent Publication No. 2006-036578 (hereinafter referred to as JP2006-036578A) reports that sintered bodies of PZT-based ceramic materials such as $Pb(Ti, Zr, Nb)O_3$ are formed of two-phase mixed crystals of tetragonal crystals and rhombohedral crystals at and near the MPB. (See, for example, claim 9 in JP2006-036578A.) Further, JP2006-036578A discloses that it is possible to desirably design the composition on the basis of the relationship between the piezoelectric coefficient and the phase fractions of the tetragonal and rhombohedral phases. (See, for example, Table 1, FIG. 4, and the paragraph 0027 in JP2006-036578A.)

According to the technique disclosed in JP2006-036578A, it is possible to prepare samples of perovskite oxides each constituted by a plurality of predetermined elements with different mole fractions, obtain the phase fractions of the tetragonal and rhombohedral phases in each sample by X-ray diffraction and Rietveld analysis, obtain the piezoelectric coefficient of each sample, and determine the composition on the basis of the relationship between the obtained phase fractions and the piezoelectric coefficient. However, according to the above technique, it is necessary to search for desirable composition by performing an experiment every time the constituent elements of the sample are changed, so that the material design cannot be efficiently made by the technique.

Further, currently, the public interest in the environmental load is increasing, and demands for lead-free piezoelectric films are increasing. However, JP2006-036578A does not disclose application of the technique disclosed in JP2006-036578A to the lead-free material.

In addition, S. Yokoyama et al., "Compositional Dependence of Electrical Properties of Highly (100)-/(001)-Oriented Pb(Zr, Ti)$O_3$ Thick Films Prepared on Si Substrates by Metalorganic Chemical Vapor Deposition", Japanese Journal of Applied Physics, Vol. 42, 2003, pp. 5922-5926 also report that PZT films are formed of two-phase mixed crystals of tetragonal crystals and rhombohedral crystals at and near the MPB. (See, for example, FIG. 2(b) in the Yokoyama reference.) However, many aspects of the piezoelectric mechanism and the crystal structure at and near the MPB are still unknown.

Further, one of the present inventors (Yukio Sakashita) and colleagues belonging to the present assignee have proposed in the Japanese Unexamined Patent Publication No. 2007-116091 (which is hereinafter referred to as JP2007-116091A) a piezoelectric device using a piezoelectric body which contains regions in a first ferroelectric phase having crystal orientation. In the piezoelectric body, the phase of at least a portion of the above regions transitions from the first ferroelectric phase corresponding to a first crystal system to a second ferroelectric phase corresponding to a second crystal system different from the first crystal system when an electric field is applied to the piezoelectric body.

In the above piezoelectric device, it is possible to achieve a volume change caused by a change in the crystal structure associated with the phase transition from the first ferroelectric phase. In addition, since the piezoelectric effect works in both of the first ferroelectric phase (before the phase transition) and the second ferroelectric phase (after the phase transition), the piezoelectric device disclosed in JP2007-116091A exhibits great displacement when the electric field is applied to the piezoelectric body.

Further, JP2007-116091A reports that the engineered-domain effect and the like increase the distortion amount (displacement) when the direction along which the electric field is applied to the piezoelectric body is different from the orientation of the spontaneous polarization axis in the ferroelectric phase before the phase transition, and is preferably approximately identical to the orientation of the spontaneous polarization axis in the ferroelectric phase after the phase transition.

SUMMARY OF THE INVENTION

The present invention has been made in view of such circumstances.

The first object of the present invention is to provide a process for producing a lead-free perovskite oxide on the basis of a novel material design principle proposed for designing a perovskite oxide superior in the piezoelectric performance (i.e., the ferroelectric performance), where the process is particularly suitable for producing a lead-free perovskite oxide for use in the piezoelectric device exploiting the phase transition induced by application of an electric field as proposed in JP2007-116091A.

The second object of the present invention is to provide a lead-free perovskite oxide which is produced by the above process.

The third object of the present invention is to provide a ferroelectric compound and a piezoelectric body containing a perovskite oxide which is produced by the above process.

The fourth object of the present invention is to provide a piezoelectric device and a liquid discharge device using the above piezoelectric body.

(I) In order to accomplish the above first object, according to the first aspect of the present invention, a process for producing a perovskite oxide is provided. In addition, in order to accomplish the above second object, according to the second aspect of the present invention, the perovskite oxide produced by the process according to the first aspect of the present invention is provided. The perovskite oxide has a composition expressed by the compositional formula, $$(Ba,Bi,A)(Ti,Fe,M)O_3, \tag{P}$$

where each of A and M represents one or more metal elements other than Pb; Ba, Bi, and A are A-site elements; Ti, Fe, and M are B-site elements; and Ba, Bi, Ti, Fe and O respectively represent barium, bismuth, titanium, iron, and oxygen. When the one or more A-site elements represented by A are Ba and/or Bi, the one or more B-site elements represented by M are elements other than Ti and Fe. When the one or more B-site elements represented by M are Ti and/or Fe, the one or more A-site elements represented by A are elements other than Ba and Bi. Although the ratio of each of the total molar amount of the A-site elements and the total molar amount of the B-site elements to the molar amount of oxygen atoms is normally 1:3, the ratio of each of the total molar amount of the A-site elements and the total molar amount of the B-site elements to the molar amount of oxygen may deviate from 1:3 within a range in which the composition expressed by the compositional formula $(Ba, Bi, A)(Ti, Fe, M)O_3$ can form a perovskite structure. The process according to the first aspect of the present invention is characterized in that the composition of the compound $(Ba, Bi, A)(Ti, Fe, M)O_3$ is determined so as to satisfy the conditions expressed by the inequalities (1) and (2).

$$0.98 \leq TF(P) \leq 1.02 \tag{1}$$

$$TF(BiFeO_3) < TF(AMO_3) < TF(BaTiO_3). \tag{2}$$

In this specification, TF(X) is the tolerance factor of an oxide expressed by the compositional formula X, although the tolerance factor of the perovskite oxide $(Ba, Bi, A)(Ti, Fe, M)O_3$ is expressed as TF(P). The tolerance factor is defined as $$TF=(rA+rO)/\sqrt{2}(rB+rO),$$

where rA is the average ionic radius of the A-site element, rB is the average ionic radius of the B-site element, and rO is the ionic radius of the oxygen ion. In this specification, the ionic radius is the Shannon ionic radius. (See R. D. Shannon, "Revised Effective Ionic Radii and Systematic Studies of Interatomic Distances in Halides and Chalcogenides", Acta Crystallographica, A32, 1976, pp. 751-767.) The average ionic radius is expressed by $\Sigma CiRi$, where Ci indicates the mole fraction of each ion in a lattice site, and Ri is the ionic radius of the ion. However, since the Shannon reference does not teach the ionic radius of Bi for ligancy 12, and Bi exhibits strong covalency, the covalent radius, instead of the ionic radius, is used for obtaining the tolerance factor TF of Bi.

It is preferable that the one or more A-site elements represented by A be Sr. When the one or more B-site elements represented by M are one or more elements other than Ti and Fe, the one or more A-site elements represented by A may be Ba, Bi, or both of Ba and Bi (which realize a solid solution of Ba and Bi). When the one or more A-site elements represented by A are one or more elements other than Ba and Bi, the one or more B-site elements represented by M may be Ti, Fe, or both of Ti and Fe (which realize a solid solution of Ti and Fe).

According to the first aspect of the present invention, the tolerance factor of each of the oxides $(Ba, Bi, A)(Ti, Fe, M)O_3$, $BaTiO_3$, $BiFeO_3$, and $AMO_3$ is theoretically obtained. (For example, TF $(BaTiO_3)$=1.062, and TF$(BiFeO_3)$=0.989.) At this time, even when one or more of the oxides do not form a perovskite structure by themselves, the tolerance factor of each of the oxides is theoretically obtained. Thus, the composition of the perovskite oxide (P) is determined so as to satisfy the aforementioned conditions.

Preferably, the perovskite oxide may be produced by the process according to the first aspect of the present invention so that the perovskite oxide further has one or any possible combination of the following additional features (i) to (iv), and the perovskite oxide according to the second aspect of the present invention may further comprise one or any possible combination of the following additional features (i) to (iv).

(i) It is preferable that the composition of the perovskite oxide $(Ba, Bi, A)(Ti, Fe, M)O_3$ be determined so as to further satisfy the condition expressed by the inequalities (3). That is, it is preferable that the composition of the perovskite oxide according to the second aspect of the present invention further satisfy the condition expressed by the inequalities (3).

$$0.98 \leq TF(AMO_3) \leq 1.02 \tag{3}$$

(ii) The phase structure of the perovskite oxide is not specifically limited. For example, the perovskite oxide may have a three-phase mixed-crystal structure in which the three components $BaTiO_3$, $BiFeO_3$, and $AMO_3$ coexist, or a single-phase structure in which the three components $BaTiO_3$, $BiFeO_3$, and $AMO_3$ are completely solid solved into a single phase. Further, the perovskite oxide may have another structure.

(iii) It is preferable that the perovskite oxide according to the second aspect of the present invention contain the first component $BaTiO_3$, the second component $BiFeO_3$, and the third component $AMO_3$. In each of the first component $BaTiO_3$, the second component $BiFeO_3$, and the third component $AMO_3$, the ratio of each of the molar amount of the A-site element and the molar amount of the B-site element to the molar amount of oxygen atoms is normally 1:3. However, the ratio of each of the molar amount of the A-site element and the molar amount of the B-site element to the molar amount of oxygen atoms may deviate from 1:3 within a range in which each of the first component $BaTiO_3$, the second component $BiFeO_3$, and the third component $AMO_3$ can form a perovskite structure.

(iv) In the perovskite oxide having the feature (iii), it is also preferable that the first component $BaTiO_3$, the second component $BiFeO_3$, and the third component $AMO_3$ form structures respectively corresponding to different crystal systems. For example, the perovskite oxide may have a mixed-crystal structure in which the first component forms a first crystal structure corresponding to a tetragonal system, the second component forms a second crystal structure corresponding to a rhombohedral system, and the third component forms a third crystal structure corresponding to one of cubic and pseudocubic systems.

(II) In addition, in order to accomplish the aforementioned second object, a perovskite oxide according to the third aspect of the present invention is also provided. The piezoelectric body according to the third aspect of the present invention is characterized in having a composition at or near a morphotropic phase boundary (MPB), and a mixed-crystal structure composed of at least two first crystal phases which are ones of tetragonal, orthorhombic, and rhombohedral phases, and at least one second crystal phase which is at least one of cubic and pseudocubic phases.

Further, in order to accomplish the aforementioned second object, a perovskite oxide according to the fourth aspect of the present invention is also provided. The piezoelectric body according to the fourth aspect of the present invention is characterized in having a composition at or near the morphotropic phase boundary (MPB), and exhibiting in a high-resolution X ray diffraction profile a first diffraction peak of a tetragonal phase, a second diffraction peak of a rhombohedral phase, and a third diffraction peak of a third phase different from the tetragonal phase and rhombohedral phases.

In this specification, the expression "at or near the MPB" means that the composition of the perovskite oxide is in a range of the composition in which the phase of the perovskite oxide transitions when an electric field is applied to the perovskite oxide.

(III) In order to accomplish the aforementioned third object, a ferroelectric compound according to the fifth aspect of the present invention is provided. The ferroelectric compound according to the fifth aspect of the present invention is characterized in containing the perovskite oxide according to one of the second to fourth aspects of the present invention.

In addition, in order to accomplish the aforementioned third object, a piezoelectric body according to the sixth aspect of the present invention is also provided. The piezoelectric body according to the sixth aspect of the present invention is characterized in containing the perovskite oxide according to one of the second to fourth aspects of the present invention. The piezoelectric body may be, for example, a piezoelectric film, which is a piezoelectric body having a thickness of 10 nanometers to 100 micrometers.

Preferably, the above piezoelectric body according to the sixth aspect of the present invention may further comprise one or any possible combination of the following additional features (v) to (x).

(v) It is preferable that the piezoelectric body be an epitaxially grown piezoelectric film.

(vi) It is preferable that the piezoelectric body have a thickness of 500 nanometers to 10 micrometers.

(vii) It is preferable that the piezoelectric body according to the sixth aspect of the present invention contain a ferroelectric phase having crystal orientation. In this specification, the expression "having crystal orientation" means that the degree F. of orientation measured by the Lotgerling technique is 80% or higher. The degree F. of orientation defined as $$F(\%)=(P-P0)/(1-P0)\times 100,$$

where P is the ratio of the total XRD (X-ray diffraction) intensity from an orientation plane to the total XRD intensity from all the crystal planes, and P0 is the value of P in the case where the sample is completely randomly oriented. In the case of the (001) orientation, $P=\Sigma I(001)/\Sigma I(hkl)$, where I(hkl) is the XRD intensity from the crystal plane (hkl), $\Sigma I(001)$ is the total XRD intensity from the crystal plane (001), and $\Sigma I(hkl)$ is the total XRD intensity from all the crystal planes (hkl). For example, in the case of the (001) orientation in a perovskite crystal, $P=I(001)/\{I(001)+I(100)+I(101)+I(110)+I(111)\}$. When the sample is completely randomly oriented, F=0%. When the sample is completely oriented, F=100%.

(viii) It is preferable that the piezoelectric body according to the sixth aspect of the present invention contain at least one ferroelectric phase, where each of the at least one ferroelectric phase has a spontaneous polarization axis along a first direction and crystal orientation along a second direction different from the first direction.

(ix) In the case where the piezoelectric body according to the sixth aspect of the present invention has the feature (viii), it is further preferable that each of the at least one ferroelectric phase is at least one of a rhombohedral phase having crystal orientation along approximately a <100> direction, a rhombohedral phase having crystal orientation along approximately a <110> direction, a tetragonal phase having crystal orientation along approximately a <110> direction, a tetragonal phase having crystal orientation along approximately a <111> direction, an orthorhombic phase having crystal orientation along approximately a <100> direction, and an orthorhombic phase having crystal orientation along approximately a <111> direction. In this specification, the expression "having crystal orientation along approximately the <abc> direction" means that the degree F. of orientation along the <abc> direction is 80% or higher.

(x) In the case where the piezoelectric body according to the sixth aspect of the present invention has the feature (viii) or (ix), it is further preferable that at least a portion of each of the at least one ferroelectric phase transitions to a ferroelectric phase corresponding to a crystal system different from a crystal system corresponding to the ferroelectric phase, when an electric field is applied to the piezoelectric body along a direction different from the direction of the spontaneous polarization axis of the ferroelectric phase.

(IV) In order to accomplish the aforementioned fourth object, a piezoelectric device according to the seventh aspect of the present invention is provided. The piezoelectric device according to the seventh aspect of the present invention is characterized in comprising the piezoelectric body according to the sixth aspect of the present invention and electrodes arranged to apply an electric field to the piezoelectric body.

In addition, in order to accomplish the aforementioned fourth object, a piezoelectric device according to the eighth aspect of the present invention is provided. The piezoelectric device according to the eighth aspect of the present invention is characterized in comprising the piezoelectric body according to the sixth aspect of the present invention and electrodes ranged to apply an electric field to the piezoelectric body, where the piezoelectric body contains a ferroelectric phase having crystal orientation along a direction different from the orientation of the spontaneous polarization axis of the ferroelectric phase, and the electrodes are arranged so that the electric field is applied to the piezoelectric body along a direction different from the orientation of the spontaneous polarization axis of the ferroelectric phase.

Further, in order to accomplish the aforementioned fourth object, a liquid discharge device according to the ninth aspect of the present invention is also provided. The liquid discharge device according to the ninth aspect of the present invention is characterized in comprising the piezoelectric device according to the seventh aspect of the present invention and a discharge member arranged adjacent to the piezoelectric device. The discharge member includes a liquid-reserve chamber and a liquid-discharge outlet, where the liquid-reserve chamber reserves liquid, and a liquid-discharge outlet arranged to externally discharge the liquid in response to application of an electric field to the piezoelectric body in the piezoelectric device. Specifically, the liquid discharge device may have a structure in which the discharge member, in whole or in part, is formed integrally with the piezoelectric device. For example, in the case where the piezoelectric device is formed with a substrate on which the piezoelectric body and the electrodes are formed, the liquid-reserve chamber may be formed integrally with the substrate.

(V) The advantages of the present invention are explained below.

One of the present inventors (Yukio Sakashita) and a colleague belonging to the present assignee have proposed in the Japanese Unexamined Patent Publication No. 2008-094707 (which is hereinafter referred to as JP2008-094707A, and corresponds to U.S. Patent Application No. 20080074471) a process for producing a perovskite oxide on the basis of a novel material design principle for designing a perovskite oxide superior in the piezoelectric performance (i.e., the ferroelectric performance), and a perovskite oxide produced by above process. The process proposed in JP2008-094707A is particularly suitable for production of a perovskite oxide for use in the piezoelectric device exploiting the phase transition induced by application of an electric field as proposed in JP2007-116091A. The process proposed in JP2008-094707A facilitates designing of the compositions of perovskite oxides at or near the MPB regardless of whether or not the perovskite oxides contain lead (Pb). The present invention an evolution of the technique disclosed in JP2008-094707A, has been made in response to demands for lead-free piezoelectric materials; and facilitates production of lead-free piezoelectric materials which are superior in the piezoelectric (ferroelectric) characteristics and the cost reduction.

The present invention presents a novel material design principle for producing a lead-free perovskite oxide superior in the piezoelectric (ferroelectric) performance, and facilitates designing of the compositions, at or near the MPB, of lead-free perovskite oxides which are superior in the piezoelectric (ferroelectric) characteristics.

In addition, according to the present invention, it is possible to provide a lead-free perovskite oxide having such a domain structure that even when the strength of the electric field applied to the perovskite oxide is relatively low, phase transition can easily occur and great distortion (displacement) is produced.

Further, when the perovskite oxide according to the present invention is used, it is possible to provide a lead-free piezoelectric device exhibiting superior piezoelectric performance.

DESCRIPTION OF THE DRAWINGS

FIG. 2 is a diagram schematically indicating a piezoelectric characteristic of a piezoelectric body which is entirely composed of a first ferroelectric phase, and transitions to a second ferroelectric phase when an electric field is applied to the piezoelectric body, where the first and the second ferroelectric phases correspond to different crystal systems.

FIGS. 3A, 3B, and 3C are diagrams illustrating examples of domains of three crystal systems in a phase transition model 1 for explaining effectiveness of use of the perovskite oxide according to the present invention in the system in which phase transition is induced by application of an electric field.

FIGS. 5A, 5B, and 5C are diagrams illustrating examples of domains of three crystal systems in a phase transition model 2 for explaining effectiveness of use of the perovskite oxide according to the present invention in the system in which phase transition is induced by application of an electric field.

DESCRIPTION OF PREFERRED EMBODIMENTS

Figure 1:
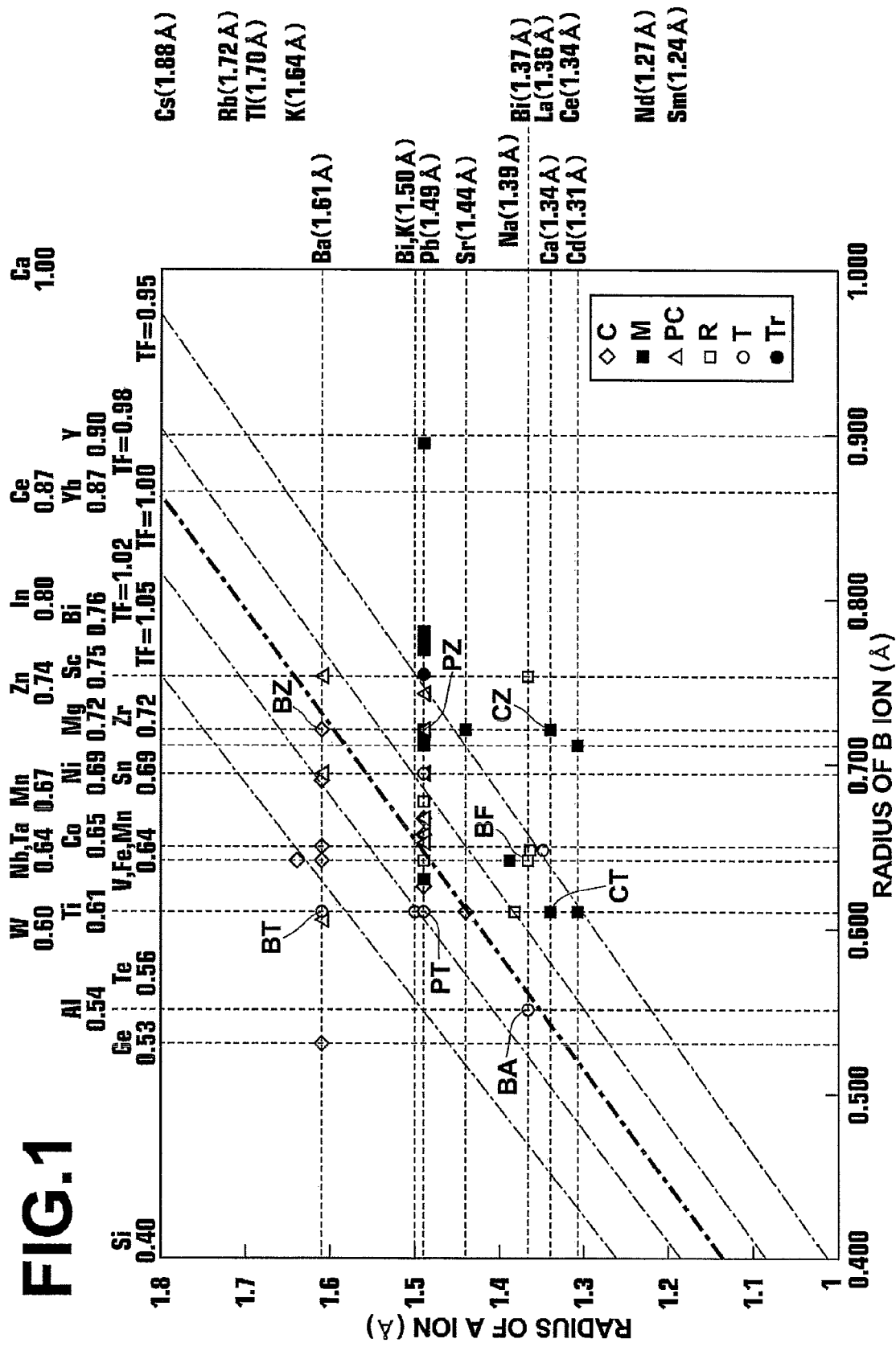
FIG. 1 is a diagram indicating the tolerance factors TF and the crystal systems of various perovskite oxides in association with the ionic radii of the A-site elements and the B-site elements.

A preferred embodiment of the present invention is explained in detail below with reference to drawings.

1. Perovskite Oxide

As explained in the "SUMMARY OF THE INVENTION," the first aspect of the present invention presents a process for producing a perovskite oxide expressed by the compositional formula, $$(Ba,Bi,A)(Ti,Fe,M)O_3, \quad (P)$$

where each of A and M represents one or more metal elements other than Pb; Ba, Bi, and A are A-site elements; Ti, Fe, and M are B-site elements; and O represents the oxygen atom. When the one or more A-site elements represented by A are Ba and/or Bi, the one or more B-site elements represented by M are elements other than Ti and Fe. When the one or more B-site elements represented by M are Ti and/or Fe, the one or more A-site elements represented by A are elements other than Ba and Bi. Although the ratio of each of the total molar amount of the A-site elements and the total molar amount of the B-site elements to the molar amount of oxygen atoms is normally 1:3, the ratio of each of the total molar amount of the A-site elements and the total molar amount of the B-site elements to the molar amount of oxygen atoms may deviate from 1:3 within a range in which the composition expressed by the compositional formula (Ba, Bi, A)(Ti, Fe, M)O$_3$ can form a perovskite structure. The process according to the first aspect of the present invention is characterized in that the composition of the compound (Ba, Bi, A)(Ti, Fe, M)O$_3$ is determined so as to satisfy the conditions expressed by the inequalities (1) and (2).

$$0.98 \leq TF(P) \leq 1.02 \quad (1)$$

$$TF(BiFeO_3) < TF(AMO_3) < TF(BaTiO_3). \quad (2)$$

As mentioned before, TF(X) is the tolerance factor of an oxide expressed by the compositional formula X, although the tolerance factor of the perovskite oxide (Ba, Bi, A)(Ti, Fe, M)O$_3$ is expressed as TF(P).

Preferably, the composition of the perovskite oxide (Ba, Bi, A)(Ti, Fe, M)O$_3$ is determined so as to further satisfy the condition expressed by the inequalities (3)

$$0.98 \leq TF(AMO_3) \leq 1.02 \tag{3}$$

In the case where the one or more B-site elements represented by M are Ti and/or Fe, the perovskite oxide expressed by the aforementioned compositional formula (P) can be expressed by the following compositional formula (PX), $$(Ba,Bi,A)(Ti,Fe)O_3, \tag{PX}$$

where A represents one or more metal elements other than Pb, Ba, and Bi; Ba, Bi, and A are A-site elements; Ti and Fe are B-site elements; Ba, Bi, Ti, Fe and O respectively represent barium, bismuth, titanium, iron, and oxygen. Although the ratio of each of the total molar amount of the A-site elements and the total molar amount of the B-site elements to the molar amount of oxygen atoms is normally 1:3, the ratio of each of the total molar amount of the A-site elements and the total molar amount of the B-site elements to the molar amount of oxygen atoms may deviate from 1:3 within a range in which the composition expressed by the compositional formula (Ba, Bi, A)(Ti, Fe)O$_3$ can form a perovskite structure.

The composition of the compound (Ba, Bi, A)(Ti, Fe)O$_3$ is determined so as to satisfy the conditions expressed by the inequalities (1a) and (2a).

$$0.98 \leq TF(PX) \leq 1.02 \tag{1a}$$

$$TF(BiFeO_3) < TF(A(Ti,Fe)O_3) < TF(BaTiO_3). \tag{2a}$$

As mentioned before, TF(X) is the tolerance factor of an oxide expressed by the compositional formula X, although the tolerance factor of the perovskite oxide (Ba, Bi, A)(Ti, Fe)O$_3$ is expressed as TF(PX).

Preferably, the composition of the perovskite oxide (Ba, Bi, A)(Ti, Fe)O$_3$ is determined so as to further satisfy the condition expressed by the inequalities (3a).

$$0.98 \leq TF(A(Ti,Fe)O_3) \leq 1.02 \tag{3a}$$

The mixing ratio of Ti and Fe in A(Ti, Fe)O$_3$ is not limited as long as the tolerance factors satisfy the inequalities (2a) and (3a).

In the case where the one or more A-site elements represented by A are Ba and/or Bi, the perovskite oxide expressed by the aforementioned compositional formula (P) can be expressed by the following compositional formula (PY), $$(Ba,Bi)(Ti,Fe,M)O_3, \tag{PY}$$

where M represents one or more metal elements other than Pb, Ti, and Fe; Ba and Bi are A-site elements; Ti, Fe, and M are B-site elements; Ba, Bi, Ti, Fe and O respectively represent barium, bismuth, titanium, iron, and oxygen. Although the ratio of each of the total molar amount of the A-site elements and the total molar amount of the B-site elements to the molar amount of oxygen atoms is normally 1:3, the ratio of each of the total molar amount of the A-site elements and the total molar amount of the B-site elements to the molar amount of oxygen atoms may deviate from 1:3 within a range in which the composition expressed by the compositional formula (Ba, Bi)(Ti, Fe, M)O$_3$ can form a perovskite structure.

The composition of the compound (Ba, Bi)(Ti, Fe, M)O$_3$ is determined so as to satisfy the conditions expressed by the inequalities (1b) and (2b).

$$0.98 \leq TF(PY) \leq 1.02 \tag{1b}$$

$$TF(BiFeO_3) < TF((Ba,Bi)MO_3) < TF(BaTiO_3). \tag{2b}$$

As mentioned before, TF(X) is the tolerance factor of an oxide expressed by the compositional formula X, although the tolerance factor of the perovskite oxide (Ba, Bi)(Ti, Fe, M)O$_3$ is expressed as TF(PY).

Preferably, the composition of the perovskite oxide (Ba, Bi)(Ti, Fe, M)O$_3$ is determined so as to further satisfy the condition expressed by the inequalities (3b).

$$0.98 \leq TF((Ba,Bi)MO_3) \leq 1.02 \tag{3b}$$

The mixing ratio of Ba and Bi in (Ba, Bi)MO$_3$ is not limited as long as the tolerance factors satisfy the inequalities (2b) and (3b).

FIG. 1 is a diagram indicating the tolerance factors TF and the crystal systems of various perovskite oxides in association with the average ionic radii of the A-site elements and the B-site elements, where ions of one or two elements reside in the A sites of the perovskite oxides, and ions of one or two elements reside in the B sites of the perovskite oxides.

In FIG. 1, C denotes the cubic crystal, M denotes the monoclinic crystal, PC denotes the pseudocubic crystal, R denotes the rhombohedral crystal, T denotes a tetragonal crystal, and Tr denotes the trigonal crystal. In addition, the ionic radii of various elements are indicated in association with the symbols for the respective elements. In particular, both of the ionic radius "0.64 (angstroms)" of the trivalent Mn ion and the ionic radius "0.67 (angstroms)" of the divalent Mn ion are indicated in FIG. 1.

When the tolerance factor TF is equal to 1.0, the crystal lattice of the perovskite structure has the closest packed structure. Since the B-site ions hardly move in the crystal lattice under this condition, the perovskite oxide is likely to have a stable structure. When the perovskite oxide has such a composition as to realize the above condition, the perovskite oxide is likely to have a crystal structure such as the cubic or pseudocubic crystal structure, and does not exhibit ferroelectricity, or exhibits very low ferroelectricity.

When the tolerance factor TF is greater than 1.0, the B-site ions are smaller than the A-site ions. Under this condition, the B-site ions are likely to enter the crystal lattice even when the crystal lattice is distorted, and to move in the crystal lattice. When the perovskite oxide has such a composition as to realize the above condition, the perovskite oxide is likely to have a crystal structure such as the tetragonal crystal (in which the spontaneous polarization axis is orientated along the <001> direction), and exhibits ferroelectricity. There is a tendency that the ferroelectricity becomes higher when the difference of the tolerance factor from 1.0 increases.

When the tolerance factor TF is smaller than 1.0, the B-site ions are greater than the A-site ions. Under this condition, the B-site ions do not enter the crystal lattice unless the crystal lattice is distorted. When the perovskite oxide has such a composition as to realize the above condition, the perovskite oxide is likely to have a crystal structure such as the orthorhombic crystal (in which the spontaneous polarization axis is orientated along the <110> direction) or the rhombohedral crystal (in which the spontaneous polarization axis is orientated along the <111> direction), and exhibits ferroelectricity. There is a tendency that the ferroelectricity becomes higher when the difference of the tolerance factor from 1.0 increases.

Table 1 shows first and second components constituting each of various mixed crystals and the mole fractions of the first and second components which realize an morphotropic phase boundary (MPB) in each mixed crystal, where the tolerance factor TF of the first component is greater than one, and the tolerance factor TF of the second component is smaller than one. Table 1 also shows the average ionic radii of the A-site and B-site ions in each mixed crystal, the tolerance factor TF of each mixed crystal, the crystal system of the monocrystal formed by each of the first and second components, the ionic radii of the A-site and B-site ions in the monocrystal, and the tolerance factor TF of the monocrystal. In Table 1, the tetragonal crystal, the orthorhombic crystal, and the rhombohedral crystal are respectively indicated by T, O, and R.

As understood from Table 1, the tolerance factors TF of the MPB compositions of the mixed crystals fall within the range of 0.98 to 1.02. Since the composition of the perovskite oxide according to the present invention is determined to satisfy the inequalities (1), the composition of the perovskite oxide according to the present invention is at or near the MPB.

the diagram of FIG. 1, $SrTiO_3$ has the tolerance factor TF of 1.002, which is approximately 1.0 (within the range of 0.98 to 1.02). Therefore, it is possible to bring the tolerance factor TF of the perovskite oxide $(Ba, Bi, A)(Ti, Fe, M)O_3$ into the range of 0.98 to 1.02 by adding $SrTiO_3$ to the mixed crystal of $BaTiO_3$ and $BiFeO_3$. In this case, the composition of the perovskite oxide becomes $(Ba, Bi, Sr)(Ti, Fe)O_3$. Alternatively, even when an oxide having the composition $AMO_3$ other than $SrTiO_3$ is added as the third component, it is possible to satisfy the conditions (1) and (2)(preferably, the conditions (1) to (3)).

Further, the perovskite oxide according to the present invention may contain one or more additive elements in the A-sites or the B-sites for improving the electric characteristics. For example, Fe, which is contained in the B-sites in the perovskite oxide according to the present invention, is a transition element, and therefore the valence of Fe is likely to vary. Consequently, the leakage current is likely to occur in the case where the perovskite oxide according to the present invention containing Fe in the B-sites is used in devices which are driven by applying an electric field. In particular, when

TABLE 1

| | | TF > 1 | | | | | TF < 1 | | | | MPB | | |
|---|---|---|---|---|---|---|---|---|---|---|---|---|---|
| | | Crystal System | Radius of A ion | Radius of B ion | TF | Fraction | | Crystal System | Radius of A ion | Radius of B ion | TF | Fraction | Radius of A ion | Radius of B ion | TF |
| PT-PZ | $PbTiO_3$ | T | 1.49 | 0.605 | 1.019 | 0.48 | $PbZrO_3$ | R | 1.49 | 0.72 | 0.964 | 0.52 | 1.49 | 0.66 | 0.990 |
| PT-PS | $PbTiO_3$ | T | 1.49 | 0.605 | 1.019 | 0.45 | $PbSnO_3$ | R | 1.49 | 0.69 | 0.978 | 0.55 | 1.49 | 0.65 | 0.996 |
| PT-BiS | $PbTiO_3$ | T | 1.49 | 0.605 | 1.019 | 0.65 | $BiScO_3$ | R | 1.46 | 0.745 | 0.943 | 0.35 | 1.48 | 0.65 | 0.991 |
| BT-BiNT | BT | T | 1.61 | 0.605 | 1.062 | 0.15 | $(Bi,Na)TiO_3$ | R | 1.425 | 0.605 | 0.996 | 0.85 | 1.45 | 0.61 | 1.006 |
| BT-BiNT | BT | T | 1.61 | 0.605 | 1.062 | 0.07 | $(Bi,Na)TiO_3$ | R | 1.425 | 0.605 | 0.996 | 0.93 | 1.44 | 0.61 | 1.001 |
| BT-BiNT | $(Bi,K)TiO_3$ | T | 1.55 | 0.605 | 1.041 | 0.20 | $(Bi,Na)TiO_3$ | R | 1.425 | 0.605 | 0.996 | 0.80 | 1.45 | 0.61 | 1.005 |
| KN-NN | $KNbO_3$ | O | 1.64 | 0.64 | 1.054 | 0.49 | $NaNbO_3$ | O | 1.39 | 0.64 | 0.967 | 0.51 | 1.51 | 0.64 | 1.010 |

For example, it is possible to design a perovskite oxide satisfying the conditions (1) and (2)(preferably, the conditions (1) to (3)) by first selecting a first material having the composition $BaTiO_3$ and a tolerance factor TF of 1.062 (i.e., TF>1.0) as the first component and a second material having the composition $BiFeO_3$ and a tolerance factor TF of 0.989 (i.e., TF<1.0) as the second component, and then appropriately determining the additive elements A and M so that the tolerance factor TF of the perovskite oxide $(Ba, Bi, A)(Ti, Fe, M)O_3$ is in the range of 0.98 to 1.02.

In the above design, the first component $BaTiO_3$ exhibiting high ferroelectricity (having a tolerance factor TF of 1.062>1.0) and the second component $BiFeO_3$ exhibiting high ferroelectricity (having a tolerance factor TF of 0.989<1.0) are selected, and the additive elements A and M are determined so that the composition of the perovskite oxide $(Ba, Bi, A)(Ti, Fe, M)O_3$ is at or near the MPB. When the additive elements A and M are selected so that the tolerance factor TF of the third component $AMO_3$ is near 1.0 (preferably, in the range of 0.98 to 1.02) and the ferroelectricity of the third component $AMO_3$ is low, it is possible to design a perovskite oxide satisfying the conditions (1) and (2)(preferably, the conditions (1) to (3)).

Specifically, it is possible to bring the tolerance factor TF of the perovskite oxide $(Ba, Bi, A)(Ti, Fe, M)O_3$ into the range of 0.98 to 1.02 by selecting $BaTiO_3$ (which has the tolerance factor TF of 1.062>1.0) and $BiFeO_3$ (which has the tolerance factor TF of 0.989<1.0) on the basis of the diagram of FIG. 1, and then adding, for example, $SrTiO_3$ or the like. According to such devices are driven at low temperature or at low frequency, the leakage current can lower the performance of the devices. For example, it is preferable that the perovskite oxide according to the present invention be doped with a very small amount of Mn. The doping with Mn can improve the leakage characteristics, and lower the film-formation temperature.

According to the present invention, the tolerance factor of each of the oxides $(Ba, Bi, A)(Ti, Fe, M)O_3$, $BaTiO_3$, $BiFeO_3$, and $AMO_3$ is theoretically obtained. At this time, even when one or more of the oxides do not form a perovskite structure by themselves, the tolerance factor of each of the oxides is theoretically obtained, and then the composition of the perovskite oxide $(Ba, Bi, A)(Ti, Fe, M)O_3$ is obtained so as to satisfy the conditions (1) and (2) (preferably, the conditions (1) to (3)). The perovskite oxides designed in accordance with the material design principle as above have composition at or near the MPB, and therefore exhibit high piezoelectric (ferroelectric) performance.

As explained in the "SUMMARY OF THE INVENTION," the phase structure of the perovskite oxide is not specifically limited. For example, the perovskite oxide may have a three-phase mixed-crystal structure in which the three components $BaTiO_3$, $BiFeO_3$, and $AMO_3$ coexist, or a single-phase structure in which the three components $BaTiO_3$, $BiFeO_3$, and $AMO_3$ are completely solid solved into a single phase, or another structure.

It is preferable that the perovskite oxide according to the present invention contain the first component $BaTiO_3$ having the tolerance factor TF greater than 1.0, the second component $BiFeO_3$ having the tolerance factor TF smaller than 1.0, and the third component $AMO_3$ having the tolerance factor TF near to 1.0. As mentioned before, in each of the first component $BaTiO_3$, the second component $BiFeO_3$, and the third component $AMO_3$, the ratio of each of the molar amount of the A-site element and the molar amount of the B-site element to the molar amount of oxygen atoms is normally 1:3. However, the ratio of each of the molar amount of the A-site element and the molar amount of the B-site element to the molar amount of oxygen atoms may deviate from 1:3 within a range in which each of the first component $BaTiO_3$, the second component $BiFeO_3$, and the third component $AMO_3$ can form a perovskite structure.

It is particularly preferable that the first component $BaTiO_3$, the second component $BiFeO_3$, and the third component $AMO_3$ form structures respectively corresponding to different crystal systems.

In a preferable example of the perovskite oxide, the crystal system of the first component $BaTiO_3$ is the tetragonal system, the crystal system of the second component $BiFeO_3$ is the rhombohedral system, and the third component $AMO_3$ is one of the cubic and pseudocubic systems.

When a perovskite oxide is designed according to the present invention, it is possible to produce the perovskite oxide having a composition at or near the MPB and a mixed-crystal structure composed of at least two crystal phases selected from the tetragonal, orthorhombic, and rhombohedral phases and at least one crystal phase selected from the cubic and pseudocubic phases.

In addition, when a perovskite oxide is designed according to the present invention, it is also possible to produce the perovskite oxide having a composition at or near the MPB, and exhibiting a first diffraction peak of a tetragonal phase, a second diffraction peak of a rhombohedral phase, and a third diffraction peak different from the first and second diffraction peaks in a high-resolution X-ray diffraction (XRD) profile.

The present inventors have confirmed that the perovskite oxide according to the present invention having a three-phase mixed-crystal structure of the first to third components ($BaTiO_3$, $BiFeO_3$, and $AMO_3$) is a material which exhibits high piezoelectric performance, and can be effectively used in the system utilizing phase transition induced by an electric field as proposed in JP2007-116091A.

2. Characteristics of Piezoelectric Body

Hereinbelow, the system utilizing phase transition induced by an electric field as proposed in JP2007-116091A is explained. This system includes a piezoelectric body having a first ferroelectric phase which forms a structure of a first crystal system. When an electric field is applied to the piezoelectric body, at least a portion of the first ferroelectric phase transitions to a second ferroelectric phase which forms a structure of a second crystal system different from the first crystal system.

First, the piezoelectric characteristic of the above piezoelectric body is explained below, where it is assumed, for simple explanation, that the entire piezoelectric body is initially in the first ferroelectric phase, which transitions to the second ferroelectric phase when an electric field is applied to the piezoelectric body, and the structures in the first and second ferroelectric phases correspond to different crystal systems. FIG. 2 schematically indicates, by the thick solid polygonal line X, a relationship between the strength of the electric field and the distortion amount in the piezoelectric body.

In FIG. 2, E1 is the minimum electric field strength at which the phase transition from the above first ferroelectric phase begins, and E2 is the electric field strength at which the phase transition is substantially completed. The "electric field strength at which the phase transition is substantially completed" is such a level of the electric field strength that the phase transition no longer occurs even when the electric field strength becomes higher than the level. In some cases, even when the electric field strength becomes higher than E2, the phase transition does not occur in a portion of the first ferroelectric phase, so that the portion in the first ferroelectric phase remains.

In the first range of the electric field strength E of 0 to E1, the distortion amount of the piezoelectric body linearly increases with increase in the electric field strength because of the piezoelectric effect in the first ferroelectric phase (before the phase transition). In the second range of the electric field strength E of E1 to E2, the distortion amount of the piezoelectric body still linearly increases with increase in the electric field strength because the change in the crystal structure associated with the phase transition causes a volume change in the piezoelectric body. In the third range of the electric field strength E greater than E2, the distortion amount of the piezoelectric body further linearly increases with increase in the electric field strength because of the piezoelectric effect in the second ferroelectric phase (after the phase transition).

As explained above, a change in the crystal structure associated with phase transition causes a volume change in the piezoelectric body, and the piezoelectric effect in the ferroelectric material works both before and after the phase transition since the piezoelectric body is in a ferroelectric phase both before and after the phase transition. Therefore, the piezoelectric body according to the present invention can achieve great distortion in each of the first range of 0 to E1, the second range of E1 to E2, and the third range greater than E2.

Further, FIG. 2 also schematically indicates the piezoelectric characteristic of the piezoelectric body in a first type of conventional piezoelectric devices (by the thick one-dot chain solid line Y), and the piezoelectric characteristic of the piezoelectric body in a second type of conventional piezoelectric devices (by the thick two-dot chain solid line Z). Specifically, the piezoelectric characteristic of the piezoelectric body in the first type of conventional piezoelectric devices is basically the same as the piezoelectric characteristic of the piezoelectric body in the piezoelectric device as proposed in JP2007-116091A in the first range of the electric field strength ($0 \leq E \leq E1$), and different from the piezoelectric characteristic of the piezoelectric body in the piezoelectric device as proposed in JP2007-116091A in the second and third ranges of the electric field strength ($E1 \leq E$), and the portion of the piezoelectric characteristic of the piezoelectric body in the first type of conventional piezoelectric devices in the second and third ranges of the electric field strength ($E1 \leq E$) is indicated by the thick one-dot chain solid line Y. In addition, the piezoelectric characteristic of the piezoelectric body in the second type of conventional piezoelectric devices is basically the same as the piezoelectric characteristic of the piezoelectric body in the piezoelectric device as proposed in JP2007-116091A in the first and second ranges of the electric field strength ($0 \leq E \leq E2$), and different from the piezoelectric characteristic of the piezoelectric body in the piezoelectric device as disclosed in JP2007-116091A in the third range of the electric field strength ($E2 \leq E$), and the portion of the piezoelectric characteristic of the piezoelectric body in the second type of conventional piezoelectric devices in the third range of the electric field strength ($E2 \leq E$) is indicated by the thick two-dot chain solid line Z.

As mentioned before in the "Description of the Related Art," in the aforementioned first type of conventional piezoelectric devices, the piezoelectric effect of expansion in the direction of the spontaneous polarization is generally utilized by applying an electric field to a ferroelectric body along the direction of the spontaneous polarization. That is, in the first type of conventional piezoelectric devices, the distortion amount of the piezoelectric body linearly increases with increase in the electric field strength until the electric field strength reaches a predetermined level. However, when the electric field strength exceeds the predetermined level, the amount of increase in the distortion is substantially reduced and the distortion amount is almost saturated.

In addition, in the second type of conventional piezoelectric devices, the piezoelectric body utilizes the phase transition between a ferroelectric phase and a paraelectric phase. In the second type of conventional piezoelectric devices, the distortion amount of the piezoelectric body linearly increases with increase in the electric field strength because of the piezoelectric effect in the first ferroelectric phase (before the phase transition) until the electric field strength reaches a level at which the phase transition begins (as the electric field strength E1 in FIG. 2). Then, the distortion amount of the piezoelectric body further linearly increases with increase in the electric field strength because the change in the crystal structure associated with the phase transition causes the volume change in the piezoelectric body until the electric field strength reaches a level at which the phase transition is substantially completed (as the electric field strength E2 in FIG. 2). However, when the electric field strength exceeds the level at which the phase transition is substantially completed (as the electric field strength E2 in FIG. 2), the piezoelectric effect does not work, so that the distortion amount does not further increase.

On the other hand, the piezoelectric body in which a first ferroelectric phase corresponding to a first crystal system transitions to a second ferroelectric phase corresponding to a second crystal system when an electric field is applied to the piezoelectric body can achieve greater distortion amount than the piezoelectric bodies in the aforementioned first and second types of conventional piezoelectric devices. Although no specific limitation is imposed on the activation of the piezoelectric body, in consideration of the distortion amount, it is preferable to activate the piezoelectric body so that the minimum electric field strength Emin and the maximum electric field strength Emax satisfy the condition expressed by the inequalities (4).

$$Emin<E1<Emax \quad (4)$$

In addition, it is particularly preferable to activate the piezoelectric body so that the minimum electric field strength Emin and the maximum electric field strength Emax satisfy the condition expressed by the inequalities (5).

$$Emin<E1 \leq E2<Emax \quad (5)$$

Further, it is preferable that the ferroelectric phase in which the phase transition occurs have crystal orientation along a direction different from the orientation of the spontaneous polarization, and it is more preferable that the ferroelectric phase after the phase transition has crystal orientation along a direction approximately identical to the orientation of the spontaneous polarization axis after the phase transition. Normally, the crystal orientation is equal to the direction of the applied electric field. It is particularly preferable to approximately equalize the direction of the applied electric field with the orientation of the spontaneous polarization axis after the phase transition, since in this case the engineered-domain effect can work before the phase transition and make the distortion amount before the phase transition greater than the distortion amount achieved by equalizing the direction of the applied electric field with the orientation of the spontaneous polarization axis before the phase transition. The engineered-domain effect in a monocrystal is explained by S. E. Park and T. R. Shrout, "Ultrahigh strain and piezoelectric behavior in relaxor based ferroelectric single crystals", Journal of Applied Physics, Vol. 82, No. 4, 1997, pp. 1804-1811.

Furthermore, the phase transition can readily occur when the direction of the applied electric field is approximately equal to the orientation of the spontaneous polarization axis after the phase transition. The present inventors consider that since the state in which the direction of the applied electric field is equal to the orientation of the spontaneous polarization axis is crystallographically stable, transition to the more stable state can readily occur. In some cases, phase transition does not occur in a portion of the ferroelectric phase even when the electric field higher than the electric field strength E2 is applied to the piezoelectric body. However, when the phase transition can readily occur, it is possible to reduce the portion the ferroelectric phase in which the phase transition does not occur even when the electric field higher than the electric field strength E2 is applied to the piezoelectric body. Therefore, in the case where the direction of the applied electric field is approximately equal to the orientation of the spontaneous polarization axis after the phase transition, it is possible to stably achieve greater distortion than in the case where the direction of the applied electric field is equal to the orientation of the spontaneous polarization axis before the phase transition.

Moreover, since the direction of the applied electric field is approximately equal to the orientation of the spontaneous polarization axis after the phase transition, the piezoelectric effect effectively works in the ferroelectric phase after the phase transition, so that it is possible to stably achieve great distortion.

As explained above, in the case where the direction of the applied electric field is approximately equal to the orientation of the spontaneous polarization axis after the phase transition, it is possible to achieve great distortion before, during, and after the phase transition. This effect works at least when the direction of the applied electric field is different from the orientation of the spontaneous polarization axis before the phase transition, and becomes more prominent when the direction of the applied electric field approaches the orientation of the spontaneous polarization axis after the phase transition.

In the above explanations, the piezoelectric body is assumed to have a single-phase structure containing only a single first ferroelectric phase corresponding to a first crystal system which transitions to a second ferroelectric phase corresponding to a second crystal system different from the first crystal system when an electric field is applied to the piezoelectric body. However, the above explanations can also be applied to piezoelectric bodies which have a mixed-crystal structure containing a ferroelectric phase corresponding to a crystal system which transitions to another ferroelectric phase corresponding to a different crystal system when an electric field is applied to the piezoelectric body.

3. Phase-transition Model 1

The present inventors have found that the perovskite oxide according to the present invention having a three-phase mixed-crystal structure composed of the first component $BaTiO_3$, the second component $BiFeO_3$, and the third component $AMO_3$ can be effectively used in the aforementioned system utilizing phase transition induced by application of an electric field. Hereinbelow, a model of phase transition in the three-phase mixed-crystal structure is explained as a phase transition model 1 with reference to FIGS. 3A, 3B, and 3C, which illustrate exemplary states of the three-phase mixed-crystal structure constituted by domains of three crystal systems in the phase transition model 1. In the phase transition model 1 indicated in FIGS. 3A, 3B, and 3C, the first component forms a tetragonal crystal (T), the second component forms a rhombohedral crystal (R), and the third component forms a pseudocubic crystal (PC).

Although the ferroelectric phase of one or each of the first and second components can transition to a different ferroelectric phase corresponding to a different crystal system, a case where the phase of the second component transitions from the rhombohedral phase (R) to a tetragonal phase (T) is taken as an example in the following explanation. In addition, in the following example, the ferroelectric phase of the first component has crystal orientation along the orientation of the spontaneous polarization axis (i.e., the electric field is applied along the orientation of the spontaneous polarization axis of the ferroelectric phase of the first component), and the ferroelectric phase of the second component has crystal orientation approximately along the orientation of the spontaneous polarization axis after the phase transition (i.e., the orientation of the applied electric field is approximately identical to the orientation of the spontaneous polarization axis of the ferroelectric phase of the second component after the phase transition). In FIGS. 3A, 3B, and 3C, the arrowed solid lines indicate the directions of the polarizations in the respective domains, and the hollow arrows bearing the reference "E" indicate the direction and the electric field strengths of the applied electric field.

As indicated in FIG. 3A, when no electric field is applied to a piezoelectric body of the perovskite oxide having the above three-phase mixed-crystal structure (i.e., when E=0), the tetragonal domains D1 of the first component and the rhombohedral domains D2 of the second component exhibit ferroelectricity, while the pseudocubic domains D3 of the third component do not exhibit ferroelectricity.

The present inventors consider that when the electric field E at a low electric field strength not exceeding the aforementioned minimum electric field strength E1 (at which the phase transition of the ferroelectric domains begins) is applied to the piezoelectric as illustrated in FIG. 3B, first, the pseudocubic domains D3 of the third component transition to ferroelectric domains having spontaneous polarization axes along the direction of the applied electric field. In the example illustrated in FIG. 3B, the entire pseudocubic domains D3 of the third component transition to tetragonal domains (T). However, in some cases, a portion of the pseudocubic domains D3 may not transition, and may remain pseudocubic.

The present inventors consider that the displacement in the pseudocubic domains D3 of the third component caused by the transition of the domains D3 induces and facilitates transition of the tetragonal domains D1 of the first component and the domains D2 of the second component (which abut the domains D3).

In the rhombohedral domains D2 of the second component in which TF<1.0, the B-site ions are greater than the A-site ions, so that the B-site ions cannot easily move. On the other hand, in the tetragonal domains D1 of the first component in which TF>1.0, the B-site ions are smaller than the A-site ions, so that the B-site ions can relatively easily move. Therefore, the present inventors consider that the displacement in the domains D3 of the third component caused by the transition of the domains D3 induces the transition of the tetragonal domains D1 of the first component more than the transition of the rhombohedral domains D2 of the second component at the low electric field strength, and therefore the domains D1 can expand along the orientation of the spontaneous polarization axis more easily than the domains D2.

The present inventors also consider that when the electric field strength is further increased, the displacement in the pseudocubic domains D3 of the third component caused by the transition of the domains D3 and/or the displacement in the tetragonal domains D1 of the first component caused by the transition of the domains D1 induce and facilitate transition of the rhombohedral domains D2 of the second component to the tetragonal phase (T). FIG. 3C shows a state of the piezoelectric body to which an electric field with the strength E higher than the electric field strength E2 (at which the phase transition of the ferroelectric phases is substantially completed) is applied. Although the entire domains D2 have transitioned to the tetragonal phase (T) in the example illustrated in FIG. 3C, in some cases, a portion of the domains D2 may not transition, and may remain rhombohedral.

Figure 4A:
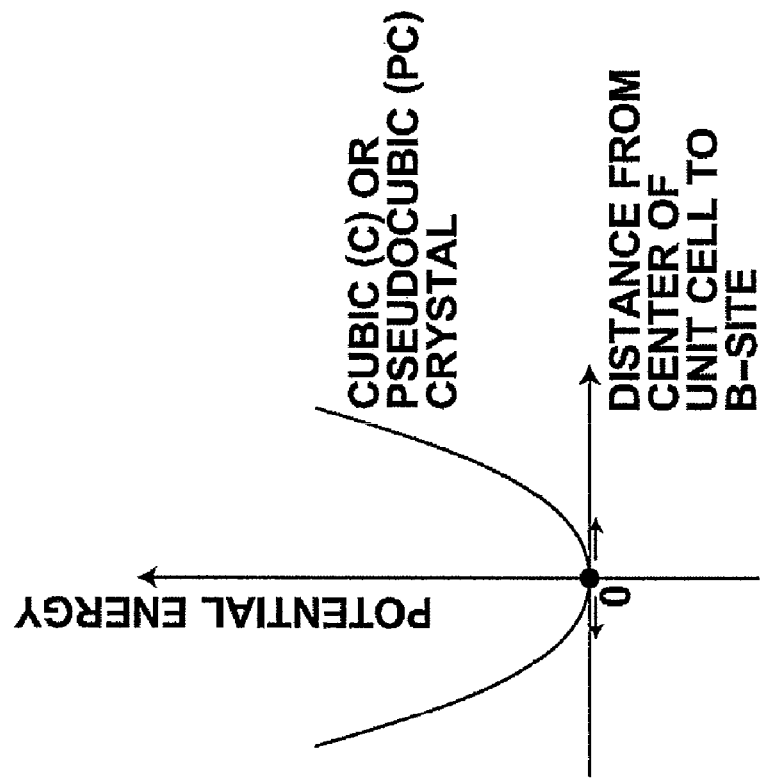
FIG. 4A is a diagram schematically indicating the relationship between the potential energy and the distance from the center to the B-site element in the unit cell of the rhombohedral crystal.
Figure 4B:
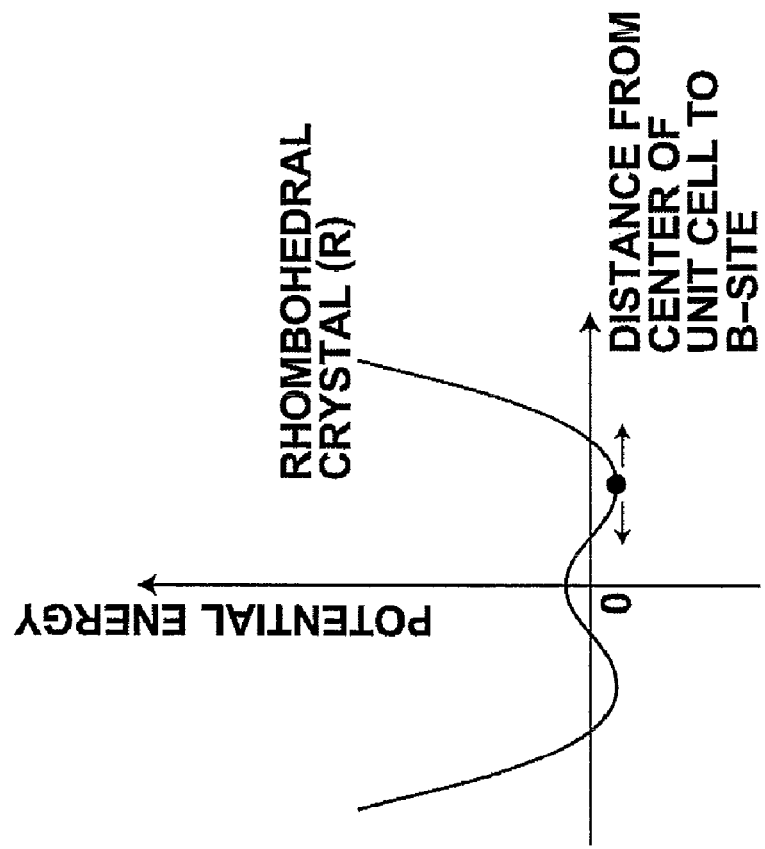
FIG. 4B is a diagram schematically indicating the relationship between the potential energy and the distance from the center to the B-site element in the unit cell of the cubic or pseudocubic crystal.

FIG. 4A is a diagram schematically indicating the relationship between the potential energy and the distance from the center to the B-site element in the unit cell of the rhombohedral crystal, and FIG. 4B is a diagram schematically indicating the relationship between the potential energy and the distance from the center to the B-site element in the unit cell of the cubic or pseudocubic crystal. As indicated in FIG. 4A, the potential energy of the rhombohedral (R) crystal is lowest (i.e., the rhombohedral crystal is most stable) when the B-site ions are at two positions slightly apart from the centers of the unit cells. On the other hand, as indicated in FIG. 4B, the potential energy of the cubic (C) or pseudocubic (PC) crystal is lowest (i.e., the cubic or pseudocubic crystal is most stable) when the B-site ions are at the centers of the unit cells.

In addition, FIG. 4B shows that the slope of the potential energy curve for the cubic (C) or pseudocubic (PC) crystal is relatively gentle when the B-site ions move slightly away from the centers of the unit cells. Therefore, it is possible to consider that the B-site ions in the cubic (C) or pseudocubic (PC) crystal can move relatively easily at relatively low electric field strength, and therefore phase transition can occur relatively easily in the cubic (C) or pseudocubic (PC) crystal. On the other hand, FIG. 4A shows that the slope of the potential energy curve for the rhombohedral (R) crystal is relatively steep when the B-site ions move slightly away from the centers of the unit cells. Therefore, it is possible to consider that the B-site ions in the rhombohedral (R) crystal can move less easily than in the cubic (C) or pseudocubic (PC) crystal; and therefore phase transition can occur less easily in the rhombohedral (R) crystal than in the cubic (C) or pseudocubic (PC) crystal. Nevertheless, the present inventors consider that the existence of the domains D3 of the third component, the phase of which transitions first, facilitates the phase transition in the rhombohedral (R) crystal.

The system in which phase transition is induced by application of an electric field according to the present invention can achieve higher piezoelectric performance than the conventional systems in which no phase transition occurs or only the phase transition from a ferroelectric phase to a paraelectric phase occurs. In addition, the present inventors consider that the existence of the domains D3 of the third component, the phase of which transitions first, facilitates the phase transition in the ferroelectric domains D1 of the first component and the ferroelectric domains D2 of the second component, and therefore higher piezoelectric performance can be achieved even at relatively low electric field strength.

Although the phase of the domains D3 of the third component is considered to transition first as explained above, the domains D3 of the third component are considered to be paraelectric when no electric field is applied to the piezoelectric body. Therefore, the minimum electric field strength E1 (at which the phase transition of the ferroelectric phase begins) is the minimum electric field strength at which the phase transition begins in either of the ferroelectric domains D1 of the first component and the ferroelectric domains D2 of the second component.

4. Phase-transition Model 2

Even in the case where the perovskite oxides designed according to the present invention have a phase structure other than the three-phase mixed-crystal structure, the perovskite oxides can be effectively used in the system utilizing phase transition induced by application of an electric field. Hereinbelow, a model of phase transition in the above phase structure is explained as a phase transition model 2 with reference to FIGS. 5A, 5B, and 5C, which illustrate exemplary states of the mixed-crystal structure constituted by domains corresponding to two crystal systems in the phase transition model 2. In the phase transition model 2, the piezoelectric body is composed mainly of a rhombohedral phase (R) when no electric field is applied, and the rhombohedral phase (R) transitions to a tetragonal phase (T) when an electric field is applied. In addition, in the following example, the ferroelectric phase (R) has crystal orientation approximately along the orientation of the spontaneous polarization axis of the tetragonal phase (T) (i.e., the orientation of the applied electric field is approximately identical to the orientation of the spontaneous polarization axis of the ferroelectric phase after the phase transition).

The present inventors consider that the phase transition in the phase transition model 2 progresses as follows.

When no electric field is applied to a piezoelectric body of the perovskite oxide having the above phase structure (i.e., when E=0), the piezoelectric body is formed mainly of a rhombohedral domain (R), and tetragonal nanodomains (T) are formed in the rhombohedral domain (R) as illustrated in FIG. 5A due to the doping with the elements A and M in the compound $(Ba, Bi, A)(Ti, Fe, M)O_3$.

The above tetragonal nanodomains (T) become the seeds (starting points) of the phase transition. That is, when an electric field with an intermediate strength E equal to or higher than the minimum electric field strength E1 (at which the phase transition of the ferroelectric domain (R) begins) is applied to the piezoelectric body which initially has the phase structure of FIG. 5A, i.e., when $E1 \leq E \leq E2$, the phase transition of the rhombohedral domain (R) develops from the tetragonal nanodomains (T), so that larger tetragonal domains (T) than the nanodomains are formed around the nanodomains as illustrated in FIG. 5B.

Thereafter, when the electric field strength is further increased, the above phase transition to the larger tetragonal domains (T) induces and facilitates displacement in and phase transition of the remaining portion of the ferroelectric domain (R), and resultantly produces great distortion induced by an electric field. FIG. 5C shows a state of the piezoelectric body when an electric field with the strength not lower than the electric field strength E2 (at which the phase transition of the ferroelectric domain (R) is substantially completed) is applied to the piezoelectric body, i.e., when $E \geq E2$. Although the entire rhombohedral domain (R) has transitioned to the tetragonal phase (T), in some cases, a portion of the rhombohedral domain (R) may not transition, and remain rhombohedral.

As explained above, the present invention presents a novel material design principle for producing a lead-free perovskite oxide which is superior in piezoelectric (ferroelectric) performance. According to the present invention, it is possible to easily design the composition of a perovskite oxide at or near the MPB so that the perovskite oxide exhibits superior piezoelectric (ferroelectric) performance.

In particular, the present invention is an evolution, into lead-free material, of the material design principle proposed in JP2008-094707A. According to the present invention, it is possible to provide a lead-free perovskite oxide having a domain structure in which phase transition can readily occur and great distortion can be achieved even at relatively low electric field strength. The feature of achieving great distortion at relatively low electric field strength is preferable for saving energy.

5. Ferroelectric Compound

As described before, the ferroelectric compound according to the present invention is characterized in containing the perovskite oxide the composition of which is designed in accordance with the material design principle according to the present invention. The ferroelectric compound according to the present invention can further contain an arbitrary component other than the perovskite oxide according to the present invention, such as a perovskite oxide other than the perovskite oxide according to the present invention, another dopant, a sintering agent, and the like.

6. Piezoelectric Device and Inkjet Recording Head

As described before, the piezoelectric device according to the present invention is characterized in comprising the piezoelectric body according to the present invention and electrodes for applying an electric field to the piezoelectric body. Since the piezoelectric device according to the present invention uses the perovskite oxide according to the present invention, the piezoelectric device according to the present invention exhibits high piezoelectric performance.

Figure 6:
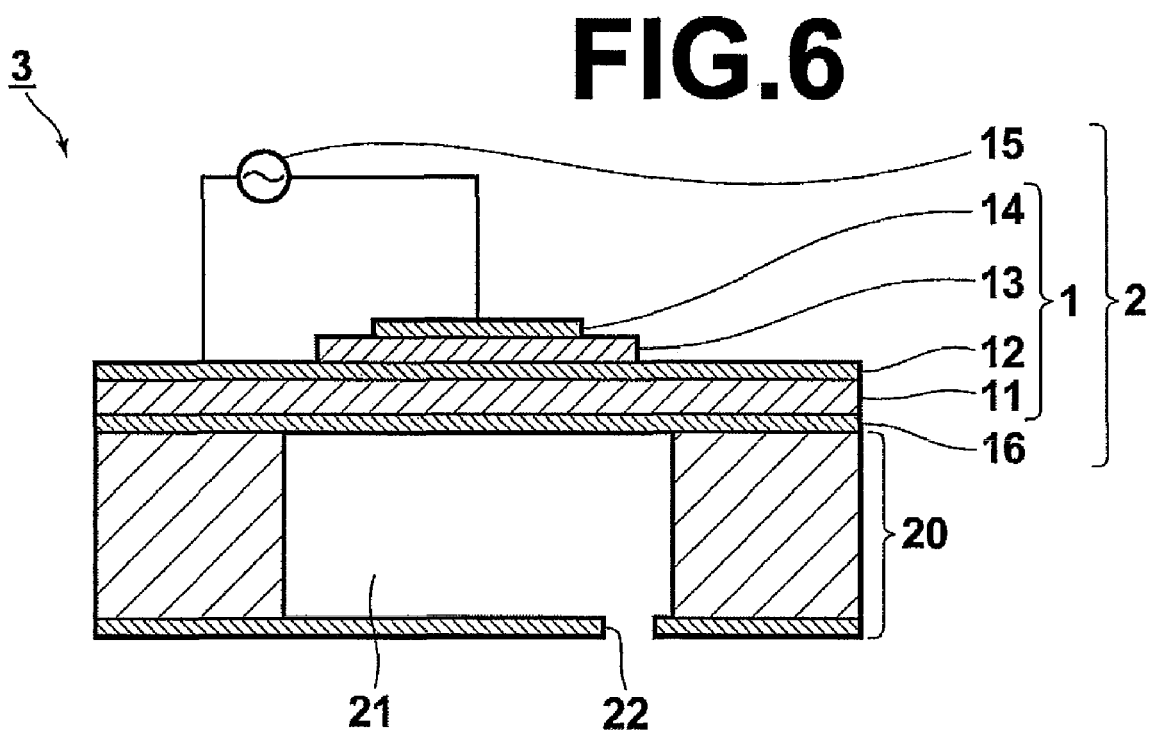
FIG. 6 is a cross-sectional view schematically illustrating a cross section of an essential portion of an inkjet recording head (as a liquid discharge device) having a piezoelectric device according to an embodiment of the present invention.

For example, in the case where the perovskite oxide according to the present invention used in a piezoelectric body in the piezoelectric device has a three-phase mixed-crystal structure composed of the first component $BaTiO_3$ with the tolerance factor TF greater than 1.0, the second component $BiFeO_3$ with the tolerance factor TF smaller than 1.0, and the third component $AMO_3$ with the tolerance factor TF near to 1.0, and the ferroelectric phase of one or each of the first and second components transitions to another ferroelectric phase having a different crystal structure in response to application of an electric field to the piezoelectric body, the piezoelectric device exhibits high piezoelectric performance even at relatively low electric field strength. Hereinbelow, the structures of the above piezoelectric device and an inkjet recording head (as a liquid discharge device) using the piezoelectric device are explained with reference to FIG. 6, which schematically shows a cross section of an essential portion of the inkjet recording head containing the above piezoelectric device, where the cross section is parallel to the thickness direction of the piezoelectric device. In FIG. 6, the respective elements are illustrated schematically, and the dimensions of the illustrated elements are different from the dimensions of the elements of actual systems.

As illustrated in FIG. 6, the inkjet recording head 3 contains a piezoelectric actuator 2, which is realized by using the piezoelectric device 1. The piezoelectric device 1 is a device produced by forming on a substrate 11 a lower electrode 12, a piezoelectric body 13; and an upper electrode 14 in this order. The piezoelectric body 13 is a polycrystalline body formed of a perovskite oxide which is designed in accordance with the material design principle according to the present invention as explained before, although the piezoelectric body may contain inevitable impurities.

The material for the substrate 11 is not specifically limited. For example, the substrate 11 may be made of one of silicon, glass, stainless steel (SUS), YSZ (yttrium stabilized zirconia), alumina, sapphire, silicon carbide, various types of monocrystalline oxides, and the like. In addition, the substrate 11 may be realized by a laminated substrate such as the SOI (silicon-on-insulator) substrate, which is produced by forming on a surface of a silicon substrate an oxide film of $SiO_2$ and a Si active layer in this order. The various types of monocrystalline oxides include, for example, strontium titanate ($SrTiO_3$), neodymium gallate ($NdGaO_3$), lanthanum aluminate ($LaAlO_3$), and magnesium oxide (MgO).

In addition, the main component of the lower electrode 12 is not specifically limited, and may be, for example, one or a combination of metals such as Au, Pt, and Ir and metal oxides such as $IrO_2$, $RuO_2$, $LaNiO_3$, and $SrRuO_3$ (SRO). Further, the main component of the upper electrodes 14 is not specifically limited, and may be, for example, one or a combination of the same materials as the examples of the main component of the lower electrode 12 and other materials (such as Al, Ta, Cr, or Cu) which are generally used in the electrodes in the semiconductor processes. Moreover, the thicknesses of the lower and upper electrodes 12 and 14 are not specifically limited, and are preferably 50 to 500 nm.

The piezoelectric actuator 2 comprises a diaphragm 16 and a controller 15 as well as the piezoelectric device 1. The diaphragm 16 is attached to the back surface of the substrate 11 so that the diaphragm 16 vibrates in correspondence with expansion and contraction of the piezoelectric body 13. The controller 15 includes a driver circuit and the like for driving the piezoelectric device 1.

The inkjet recording head 3 is produced by attaching an ink nozzle 20 to the back surface of the piezoelectric actuator 2. The ink nozzle 20 is a member for reserving and discharging ink, and comprises an ink chamber 21 (as a liquid-reserve chamber) and an ink outlet 22 (as a liquid-discharge outlet). The ink chamber 21 reserves ink, and the ink held in the ink chamber 21 is discharged out of the ink chamber 21 through the ink outlet 22 connected to the ink chamber 21.

In the above inkjet recording head 3, the strength of the electric field applied to the piezoelectric device 1 is increased or decreased so as to expand or contract the piezoelectric element and control the discharge and the discharge amount of the ink.

Alternatively, it is possible to produce the diaphragm 16 and the ink nozzle 20 by micromachining of portions of the substrate 10, instead of attaching the diaphragm 16 and the ink nozzle 20 to the piezoelectric device 1. For example, in the case where the substrate 11 is realized by a laminated substrate such as an SOI substrate, the ink chambers 21 can be formed by etching the corresponding portions of the bottom surface of the substrate 11, and the diaphragm 16 and the other structures of the ink nozzle 20 can be formed by micromachining of the substrate 11 per se.

The form of the piezoelectric body 13 can be designed as appropriate. For example, the piezoelectric body 13 may have the form of a film or a sintered ceramic body. In the field of the inkjet recording heads and the like, techniques for more densely arranging piezoelectric elements (devices) are currently being studied in order to improve image quality. In association with the increase in the density of the arrangement of piezoelectric elements, techniques for reduction in the thicknesses of the piezoelectric devices are also being studied. In order to reduce the thickness of the piezoelectric device, the piezoelectric body 13 is preferably a piezoelectric film, and more preferably a thin piezoelectric film having the thickness of 20 micrometers or smaller. Since the thin piezoelectric film is required to have a high piezoelectric coefficient, and the perovskite oxide according to the present invention has a high piezoelectric coefficient, the perovskite oxide according to the present invention can be effectively used as the material for the thin piezoelectric film.

According to the present embodiment, the piezoelectric body 13 may have a three-phase mixed-crystal structure composed of the first component $BaTiO_3$ with the tolerance factor TF greater than 1.0, the second component $BiFeO_3$ with the tolerance factor TF smaller than 1.0, and the third component $AMO_3$ with the tolerance factor TF near to 1.0, and the ferroelectric phase of one or each of the first and second components transitions to another ferroelectric phase having a different crystal structure in response to application of an electric field to the piezoelectric body.

For example, the piezoelectric body 13 has the composition expressed by the compositional formula (PZ).

$$(Ba,Bi,Sr)(Ti,Fe)O_3, \qquad (PZ)$$

In the compositional formula (PZ), Ba, Bi, and Sr are A-site elements, T and Fe are B-site elements. The ratio of each of the molar amount of the A-site element and the molar amount of the B-site element to the molar amount of oxygen atoms is normally 1:3. However, the ratio of each of the molar amount of the A-site element and the molar amount of the B-site element to the molar amount of oxygen atoms may deviate from 1:3 within a range in which the perovskite oxide (PZ) can form a perovskite structure.

According to the present embodiment, preferably, the ferroelectric phase or phases which transition in response to application of the electric field have crystal orientation. More preferably, the crystal orientation of each ferroelectric phase which transitions is along a direction different from the orientation of the spontaneous polarization axis in the ferroelectric phase, and particularly preferably, the crystal orientation is approximately identical to the orientation of the spontaneous polarization axis after the phase transition. According to the present embodiment, the crystal orientation is identical to the direction of the electric field applied to the piezoelectric body.

The spontaneous polarization axis of the ferroelectric material is <001> in the tetragonal system, <110> in the orthorhombic system, and <111> in the rhombohedral system. It is possible to equalize the direction of the electric field applied to the piezoelectric body with the spontaneous polarization axis after the phase transition when the ferroelectric phase of the one or each of the first and second components is one of the rhombohedral phase having crystal orientation along approximately the <100> direction, the rhombohedral phase having crystal orientation along approximately the <110> direction, the tetragonal phase having crystal orientation along approximately the <110> direction, the tetragonal phase having crystal orientation along approximately the <111> direction, the orthorhombic phase having crystal orientation along approximately the <100> direction, and the orthorhombic phase having crystal orientation along approximately the <111> direction.

For example, the piezoelectric body 13 having the crystal orientation may be an orientated film (having single-axis orientation), an epitaxial film (having three-axis orientation), or a grain-oriented, sintered ceramic body. The orientated film can be formed under a condition enabling production of a single-axis oriented crystal, by using one of the known thin-film formation techniques including the vapor-phase techniques and the liquid-phase techniques, where the vapor-phase techniques include sputtering, MOCVD (metal organic chemical vapor deposition), pulsed-laser deposition, and the like, and the liquid-phase techniques include the sol-gel technique, MOD (metal organic decomposition), and the like. For example, the (100) orientation can be realized by using (100)- oriented platinum or the like as the lower electrode. The epitaxial film can be formed by using, in the substrate and the lower electrode, materials which lattice-match well with the piezoelectric film. For example, preferable combinations of the materials for the lower electrode and the substrate are $SrRuO_3/SrTiO_3$, Pt/MgO, SRO/MgO/Si, and the like. The grain-oriented, sintered ceramic body can be formed by the hot-pressing technique, the sheet technique, the lamination press technique, and the like.

The condition for driving the piezoelectric body 13 by the controller 15 is not specifically limited. However, as explained before with reference to FIG. 2, in consideration of the distortion amount, the piezoelectric body 13 is preferably driven by the controller 15 so that the minimum electric field strength Emin and the maximum electric field strength Emax satisfy the condition expressed by the inequalities (4).

$$Emin<E1<Emax \quad (4)$$

In addition, it is particularly preferable that the minimum electric field strength Emin and the maximum electric field strength Emax satisfy the condition expressed by the inequalities (5).

$$Emin<E1<E2\leq Emax \quad (5)$$

In the above inequalities (4) and (5), E1 is the minimum electric field strength at which the phase transition of the ferroelectric phase of one or each of the first and second components begins, and E2 is the electric field strength at which the phase transition is substantially completed.

In addition, it is preferable to design the piezoelectric device 1 according to the present embodiment so that the phase transition can be realized basically by only changing the electric field strength. Specifically, it is preferable to determine the composition of the piezoelectric body 13 and the crystal systems of the ferroelectric phases before and after the phase transition, so that the phase transition can occur at the environmental temperature of the piezoelectric body 13. However, when necessary, it is possible to adjust the operational temperature of the piezoelectric device 1 so that the phase transition can occur. In any case, in order to efficiently utilize the phase transition, it is preferable to drive the piezoelectric device 1 at or near the phase transition temperature.

Since the piezoelectric device 1 according to the present invention uses the piezoelectric body 13 formed of the perovskite oxide which is designed in accordance with the material design principle according to the present invention, the piezoelectric device 1 can exhibit high piezoelectric performance even at relatively low electric field strength.

7. Inkjet Recording Apparatus

Figure 7:
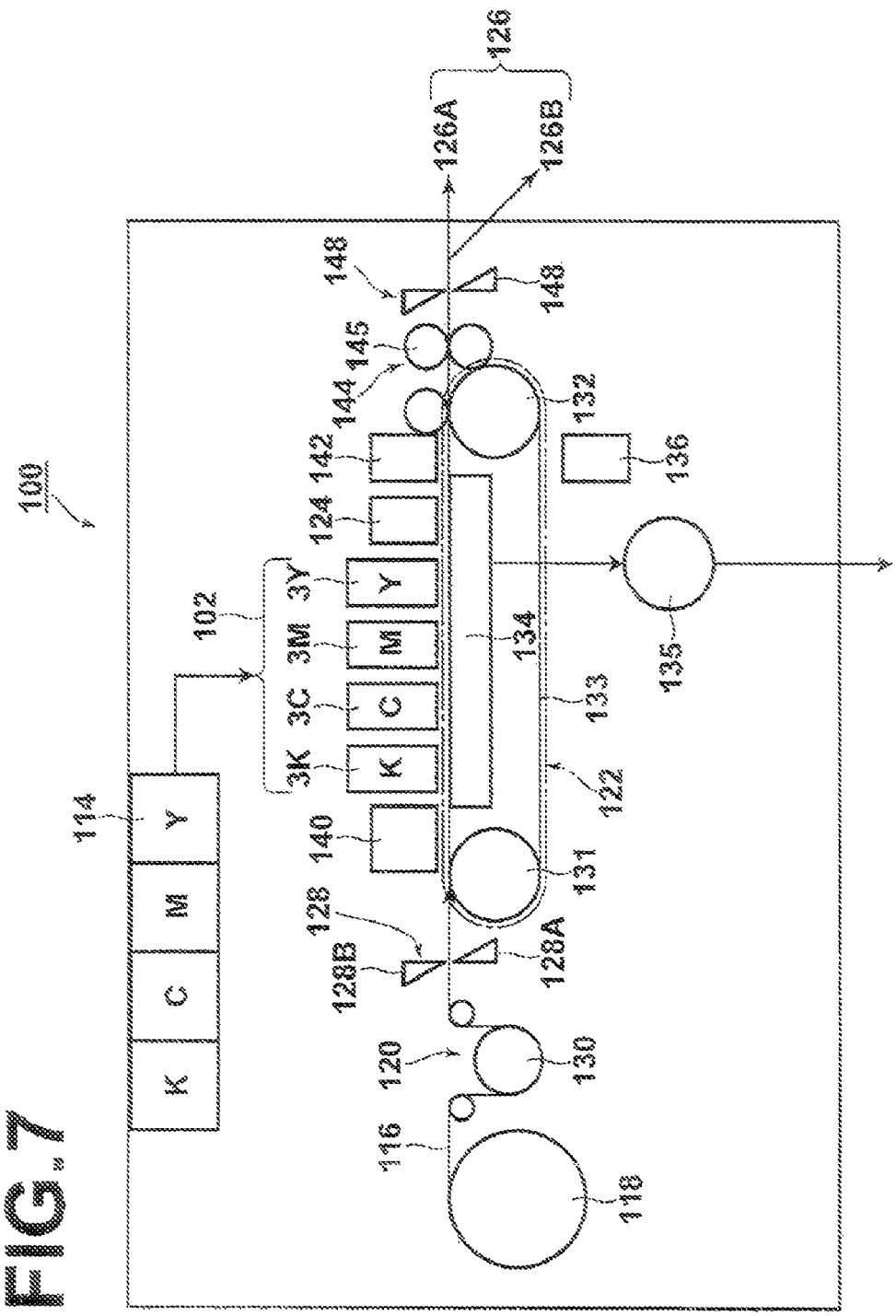
FIG. 7 is a schematic diagram of an example of an inkjet recording apparatus having the inkjet recording head of FIG. 6.
Figure 8:
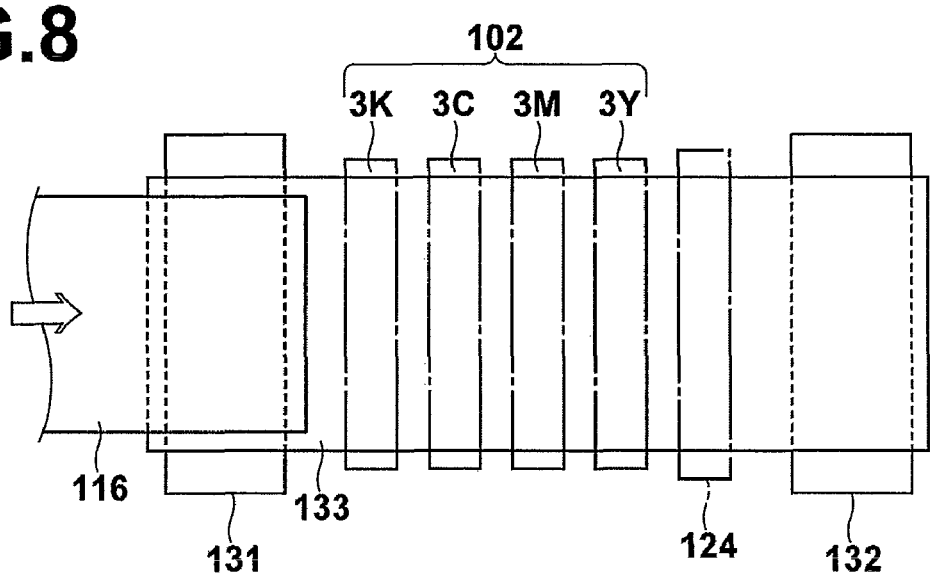
FIG. 8 is a top view of a portion of the inkjet recording apparatus of FIG. 7.

Hereinbelow, an example of an inkjet recording apparatus having the inkjet recording head 3 is explained with reference to FIGS. 7 and 8. FIG. 7 is a schematic diagram illustrating an outline of an example of an inkjet recording apparatus having the inkjet recording head 3 of FIG. 6, and FIG. 8 is a top view of a portion of the inkjet recording apparatus of FIG. 7.

As schematically illustrated in FIG. 7, the inkjet recording apparatus 100 comprises a printing unit 102, an ink reserve-and-load unit 114, a sheet feeding unit 118, a decurling unit 120, a suction-type belt conveyer 122, a print detection unit 124, and a sheet output unit 126. The printing unit 102 comprises a plurality of inkjet recording heads 3K, 3C, 3M, and 3Y corresponding to inks of different colors (specifically, black (K), cyan (C), magenta (M), and yellow (Y)). Hereinafter, the inkjet recording heads may be referred to as heads. The ink reserve-and-load unit 114 reserves the inks to be supplied to the heads 3K, 3C, 3M, and 3Y. The sheet feeding unit 118 feeds a recording sheet 116. The decurling unit 120 eliminates curl of the recording sheet 116. The suction-type belt conveyer 122 is arranged to face the nozzle faces (ink-discharge faces) of the printing unit 102, and conveys the recording sheet 116 while maintaining the flatness of the recording sheet 116. The print detection unit 124 reads an image printed on the recording sheet 116 by the printing unit 102. The sheet output unit 126 externally outputs a printed recording sheet 116.

Each of the heads 3K, 3C, 3M, and 3Y constituting the printing unit 102 corresponds to the inkjet recording head according to the present embodiment as explained before, although, in order to realize a linear head (explained later), each inkjet recording head used in the inkjet recording apparatus 100 comprises a plurality of piezoelectric devices on the lower electrode 12, and a plurality of ink chambers and a plurality of ink outlets are arranged in correspondence with the arrangement of the plurality of piezoelectric devices on the lower electrode 12.

The decurling unit 120 performs decurling of the recording sheet 116 by heating the recording sheet 116 with a heating drum 130 so as to eliminate the curl produced in the sheet feeding unit 118.

In the case where the inkjet recording apparatus 100 uses roll paper, a cutter 128 for cutting the roll paper into desired size is arranged in the stage following the decurling unit 120. The cutter 128 is constituted by a fixed blade 128A and a round blade 128B. The fixed blade 128A has a length equal to or greater than the width of the conveying path of the recording sheet 116, and is arranged on the side opposite to the print side of the recording sheet 116. The round blade 128B is arranged opposite to the fixed blade 128A on the print side of the recording sheet 116, and moves along the fixed blade 128A. In the inkjet recording apparatuses using cut paper, the cutter 128 is unnecessary.

After the roll paper is decurled and cut into the recording sheet 116, the recording sheet 116 is transferred to the suction-type belt conveyer 122. The suction-type belt conveyer 122 is constituted by rollers 131 and 132 and an endless belt 133. The rollers 131 and 132 are placed apart and the endless belt 133 is looped around the rollers 131 and 132 in such a manner that at least portions of the endless belt 133 which face the nozzle faces of the printing unit 102 and the sensor face of the print detection unit 124 are flat and horizontal.

The endless belt 133 has a width greater than the width of the recording sheet 116, and a great number of suction pores (not shown) are formed through the endless belt 133. A suction chamber 134 is arranged inside the loop of the endless belt 133 at the position opposite to the nozzle faces of the printing unit 102 and the sensor face of the print detection unit 124, and suctioned by a fan 135, so that a negative pressure is generated in the suction chamber 134, and the recording sheet 116 on the endless belt 133 is held by suction.

The power of a motor (not shown) is transmitted to at least one of the rollers 131 and 132 so that the endless belt 133 is driven clockwise in FIG. 7, and the recording sheet 116 held on the endless belt 133 is moved from left to right in FIG. 7.

In the case of borderless printing, ink can be deposited on the endless belt 133. Therefore, in order to clean the endless belt 133, a belt cleaning unit 136 is arranged at a predetermined (appropriate) position outside the loop of the endless belt 133 and the printing region.

A heating fan 140 is arranged on the upstream side of the printing unit 102 above the conveying path of the recording sheet 116 (which is realized by the suction-type belt conveyer 122). The heating fan 140 blows heated air to the recording sheet 116 before printing so as to heat the recording sheet 116 and facilitate drying of deposited ink.

Each of the heads 3K, 3C, 3M, and 3Y in the printing unit 102 is a so-called full-line type head, which is a linear head having a length corresponding to the maximum width of the recording sheet 116, and being arranged across the width of the recording sheet 116 (i.e., in the main scanning direction perpendicular to the feeding direction of the recording sheet 116) as illustrated in FIG. 8. Specifically, each of the heads 3K, 3C, 3M, and 3Y is a linear head in which the aforementioned plurality of ink-discharge outlets (nozzles) are arrayed over a length exceeding the maximum length of a side of the largest recording sheet 116 on which the inkjet recording apparatus 100 can print an image. The heads 3K, 3C, 3M, and 3Y corresponding to the inks of the different colors are arrayed upstream in this order along the feeding direction as illustrated in FIG. 8. Thus, a color image can be printed on the recording sheet 116 by discharging the inks of the different colors while conveying the recording sheet 116.

The print detection unit 124 may be constituted by, for example, a line sensor which takes an image formed of spots of the inks discharged from the printing unit 102, and detects, from the image taken by the line sensor, incomplete discharge, which can be caused by clogging of a nozzle or the like.

A rear drying unit 142 for drying the printed surface of the recording sheet 116 is arranged in the stage following the print detection unit 124. For example, the rear drying unit 142 is realized by a heating fan or the like. Since it is preferable to avoid contact with the printed surface before the ink on the printed surface is completely dried, it is preferable that the rear drying unit 142 dry the ink on the printed surface by blowing heated air.

In order to control the glossiness of the image printed on the recording sheet 116, a heating-and-pressurizing unit 144 is arranged in the stage following the rear drying unit 142. The heating-and-pressing unit 144 comprises a pressure roller 145 with a surface having predetermined projections and depressions, and transfers the predetermined projections and depressions to the printed surface of the recording sheet 116 by pressing the printed surface with the pressure roller 145 while heating the printed surface.

Finally, the printed recording sheet 116 produced as above is outputted from the sheet output unit 126. It is preferable to separately output test prints and prints for practical use. Therefore, the sheet output unit 126 includes a first output unit 126A for the prints for practical use and a second output unit 126B for the test prints. Although not shown, the inkjet recording apparatus 100 further comprises a sorting unit which sorts the printed recording sheets 116 into the test prints and the prints for practical use, and sends the test prints to the first output unit 126B, and the prints for practical use to the second output unit 126A.

Further, in the case where both of a test image and an image for practical use are concurrently printed on a recording sheet 116, it is possible to arrange a cutter 148, and separate a first portion of the recording sheet 116 on which the test image is printed and a second portion of the recording sheet 116 on which the image for practical use is printed.

8. Concrete Example of the Present Invention

The present inventors have produced a concrete example of the piezoelectric device according to the present invention as indicated below.

Before production, the material design of a perovskite-oxide film for the concrete example of the piezoelectric device has been made so that the overall tolerance factor TF of the perovskite-oxide film falls within the range of 0.98 to 1.02, where the perovskite-oxide film is composed of a first component $BaTiO_3$ having a tolerance factor TF of 1.062 (greater than 1.0), a second component $BiFeO_3$ having a tolerance factor TF of 0.989 (smaller than 1.0), and a third component $SrTiO_3$ having a tolerance factor TF of 1.002. The calculation for the material design has been performed on the precondition that 5 mol % of $BiMnO_3$ having a tolerance factor TF of 0.989 is added for suppressing leakage current and lowering the film-formation temperature. In order to equalize the influences on the other parameters, the mole fraction of $BiMnO_3$ has been fixed to 5 mol %.

Specifically, the compositions of perovskite oxides (Ba, Bi, Sr)(Ti, Fe, Mn)$O_3$ in the concrete example have been determined by fixing the mole fraction of $SrTiO_3$ to 10 mol %, and varying the ratio (1−x):x between the molar amounts of the first and second components $BiFeO_3$ and $BaTiO_3$ as indicated in Table 2. The tolerance factors TF of the perovskite oxides (Ba, Bi, Sr)(Ti, Fe, Mn)$O_3$ for various values of the fraction x of $BaTiO_3$ are obtained by the following formula.

$$TF((Ba,Bi,Sr)(Ti,Fe,Mn)O_3) = 0.85\{xTF(BiFeO_3) + (1-x)TF(BaTiO_3)\} + 0.1TF(SrTiO_3) + 0.05TF(BiMnO_3)$$

TABLE 2

| x | TF((Ba,Bi,Sr)(Ti,Fe,Mn)$O_3$) |
|---|---|
| 0 | 1.053 |
| 0.1 | 1.046 |
| 0.2 | 1.040 |
| 0.3 | 1.034 |
| 0.4 | 1.028 |
| 0.5 | 1.022 |
| 0.6 | 1.015 |
| 0.7 | 1.009 |
| 0.8 | 1.003 |
| 0.9 | 0.997 |
| 1.0 | 0.990 |

In addition, the compositions of perovskite oxides (Ba, Bi)(Ti, Fe, Mn)$O_3$ in the concrete example not containing $SrTiO_3$ have been determined by varying the ratio (1−x):x between the molar amounts of the first and second components $BiFeO_3$ and $BaTiO_3$ as indicated in Table 3. The tolerance factors TF of the perovskite oxides (Ba, Bi)(Ti, Fe, Mn)$O_3$ for various values of the fraction x of $BaTiO_3$ are obtained by the following formula.

$$TF((Ba,Bi)(Ti,Fe,Mn)O_3) = 0.95\{xTF(BiFeO_3) + (1-x)TF(BaTiO_3)\} + 0.05TF(BiMnO_3)$$

TABLE 3

| x | TF((Ba,Bi)(Ti,Fe,Mn)$O_3$) | $\epsilon_{33}$ |
|---|---|---|
| 0 | 1.058 | 182 |
| 0.1 | 1.051 | — |
| 0.2 | 1.044 | — |
| 0.3 | 1.038 | — |
| 0.4 | 1.031 | 187 |
| 0.5 | 1.024 | 208 |
| 0.6 | 1.017 | 237 |
| 0.7 | 1.010 | 326 |
| 0.8 | 1.003 | 331 |
| 0.9 | 0.996 | 180 |
| 1.0 | 0.989 | 148 |

As indicated in Tables 2 and 3, all of the perovskite oxides having the composition (Ba, Bi, Sr)(Ti, Fe, Mn)$O_3$ or (Ba, Bi)(Ti, Fe, Mn)$O_3$ with a value of the fraction x of $BaTiO_3$ within the range of 0.6 to 1.0 satisfy the aforementioned inequalities (1).

Next, piezoelectric films of the perovskite oxides designed as above have been formed on a substrate by pulsed-laser deposition (PLD), where the substrate is a Si substrate having the dimensions of 10 mm×10 mm and the thickness of 0.5 mm, and the naturally oxidized surface portion of the substrate has been removed before the formation of the piezoelectric films. Then, XRD structural analysis and evaluation of the electric characteristics of the formed piezoelectric films have been performed.

Specifically, piezoelectric devices having the above (Ba, Bi)(Ti, Fe, Mn)$O_3$ films as the piezoelectric films have been produced as follows.

First, a buffer layer of MgO and a lower electrode of SrRuO$_3$ (SRO) have been formed by epitaxial growth on a surface of the substrate. The epitaxial growth has been realized by pulsed-laser deposition (PLD), where an ArF excimer laser has been used, the laser wavelength has been 248 nm, the oscillation intensity has been 200 mJ, the laser pulse frequency has been 5 Hz, the distance between the substrate and the target has been 50 mm, the target rotation speed has been 9.7 rpm, a (commercially available) Mg metal target and a sintered body of SRO (manufactured by Toshima Manufacturing Co., Ltd.) have been used as targets, the substrate temperature has been 400° C. during the formation of the buffer layer of MgO, and 700° C. during the formation of the buffer layer of SRO, and the oxygen partial pressure has been 1 mTorr (=0.13 Pa) during the formation of the buffer layer of MgO, and 10 mTorr (=1.33 Pa) during the formation of the buffer layer of SRO.

Next, the films of the perovskite oxides (Ba, Bi)(Ti, Fe, Mn)$O_3$ respectively having the fractions x of 0, 0.4, 0.5, 0.6, 0.7, 0.75, 0.8, 0.85, 0.8, 0.95, and 1.0 have been formed on the lower electrode of SRO by PLD so as to have a thickness of 2 micrometers. The type of the laser, the laser wavelength, the oscillation intensity, the laser pulse frequency, the distance between the substrate and the target, and the target rotation speed which have been used for the formation of the (Ba, Bi)(Ti, Fe, Mn)$O_3$ films are similar to those used in the formation of the buffer layer of MgO and the lower electrode of SRO, although the oxygen partial pressure has been 50 mTorr (=6.67 Pa) and the substrate temperature has been 600° C.

Figure 9:
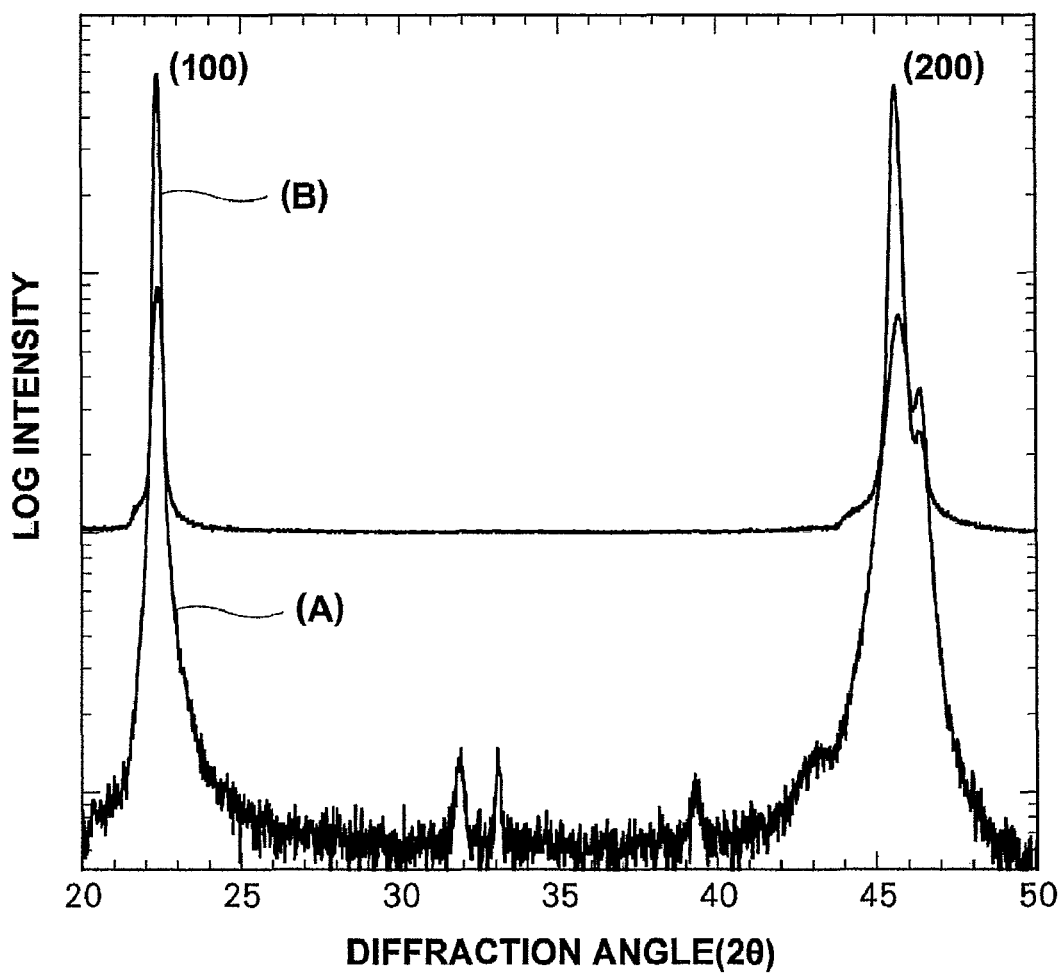
FIG. 9 is a graph indicating the XRD profile of a (Ba, Bi)(Ti, Fe, Mn)O$_3$ film and the XRD profile of a (Ba, Bi, Sr)(Ti, Fe, Mn)O$_3$ film in the concrete example 1.

Subsequently, the crystal structures of the (Ba, Bi)(Ti, Fe, Mn)$O_3$ films formed as above have been analyzed by XRD, and all the (Ba, Bi)(Ti, Fe, Mn)$O_3$ films have been confirmed to be a (100)-oriented, single-phase perovskite film. The XRD profile of the (Ba, Bi)(Ti, Fe, Mn)$O_3$ film with the fraction x of 0.8 as a representative of the (Ba, Bi)(Ti, Fe, Mn)$O_3$ films is indicated in FIG. 9 by the reference (A). In the XRD profile (A) indicated in FIG. 9, the peak at the diffraction angle of approximately 22 degrees corresponds to the (100) face of the piezoelectric film, and the peak at the diffraction angle of approximately 45 degrees corresponds to the (200) face the piezoelectric film. Thus, the (Ba, Bi)(Ti, Fe, Mn)$O_3$ film with the fraction x of 0.8 has been confirmed to be a single-phase perovskite film on the basis of the positions of the above peaks. In addition, since no peaks corresponding to the other face orientations have been observed, the (Ba, Bi) (Ti, Fe, Mn)$O_3$ film with the fraction x of 0.8 has been confirmed to be a (100)- or (001)-oriented film. (The small peak appearing on the right hand side of the (200) peak of the piezoelectric film is the (200) peak of the lower electrode of SRO.) Further, the (Ba, Bi)(Ti, Fe, Mn)$O_3$ films have also been analyzed by reciprocal lattice mapping, RHEED (reflection high energy electron diffraction), and observation by a TEM (transmission electron microscope), and confirmed to be an epitaxial film.

Thereafter, an upper electrode of Pt having a thickness of 10 micrometers is formed on each of the (Ba, Bi)(Ti, Fe, Mn)$O_3$ films by sputtering. Thus, the piezoelectric devices respectively having the (Ba, Bi)(Ti, Fe, Mn)$O_3$ films have been obtained. Then, the (static) permittivity $\epsilon_{33}$ of each of the piezoelectric devices has been measured, and the piezoelectric performance of each of the piezoelectric devices has been evaluated. In the measurement of the permittivity $\epsilon_{33}$, an impedance analyzer (available from Solartron Analytical through Toyo Corporation) has been used. In the evaluation of the piezoelectric performance, a cantilever (having the dimensions of 15 mm×2.5 mm and the thickness of 0.5 mm) has been produced with each of the piezoelectric devices, a voltage of 20V has been applied to the piezoelectric device, and the displacement of the tip of the cantilever has been measured.

Figure 10:
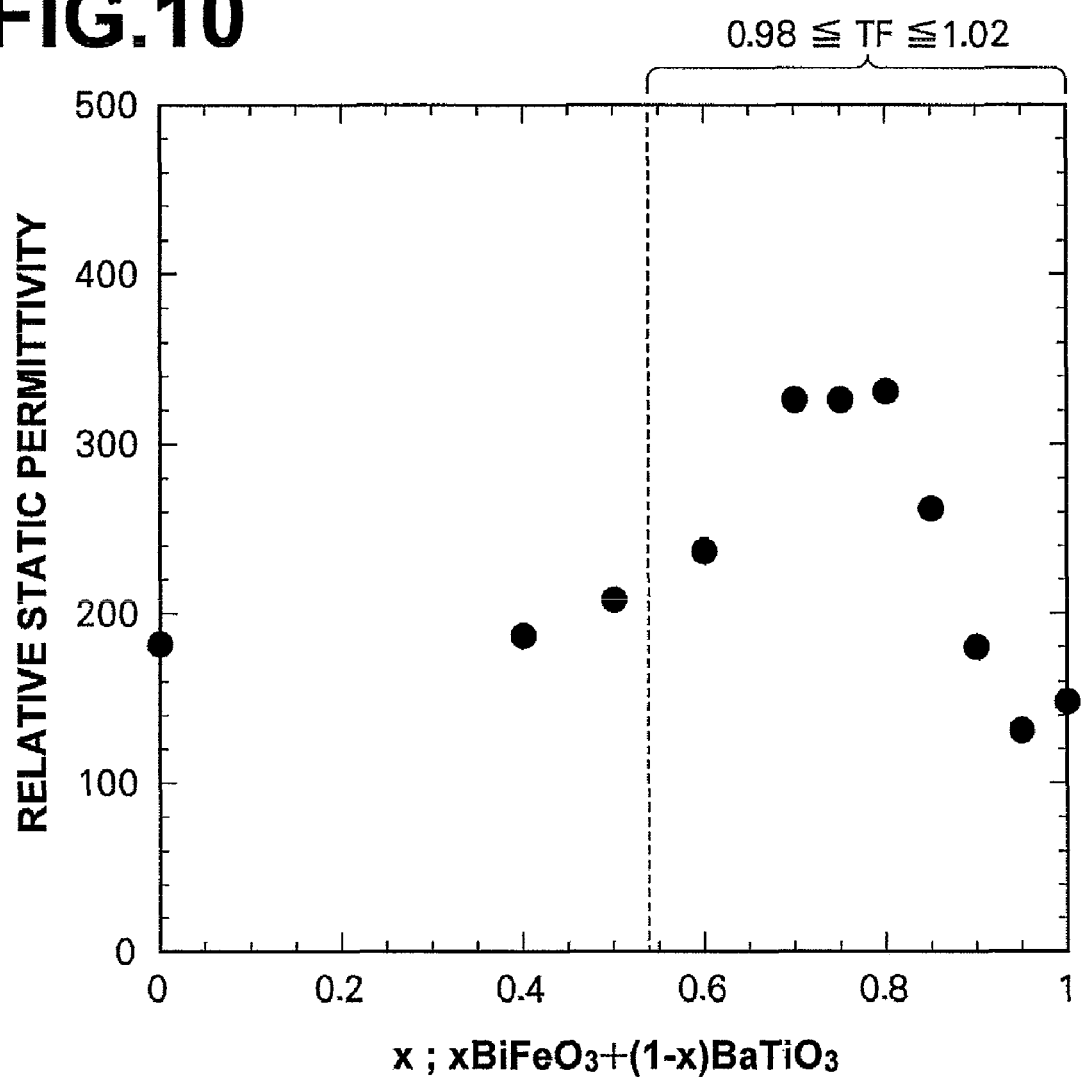
FIG. 10 is a graph indicating the relationship between the composition and the relative static permittivity of a (Ba, Bi) (Ti, Fe, Mn)O$_3$ film in the concrete example 1.

The result of the measurement of the permittivity is indicated in Table 3 and FIG. 10. FIG. 10 indicates variations of the measured, relative static permittivity with the fraction x of BiFeO$_3$. As indicated in FIG. 10, the permittivity increases in the range of the fraction x from 0.6 to 0.9, and has a local maximum in the range of the fraction x from 0.7 to 0.8.

Figure 11:
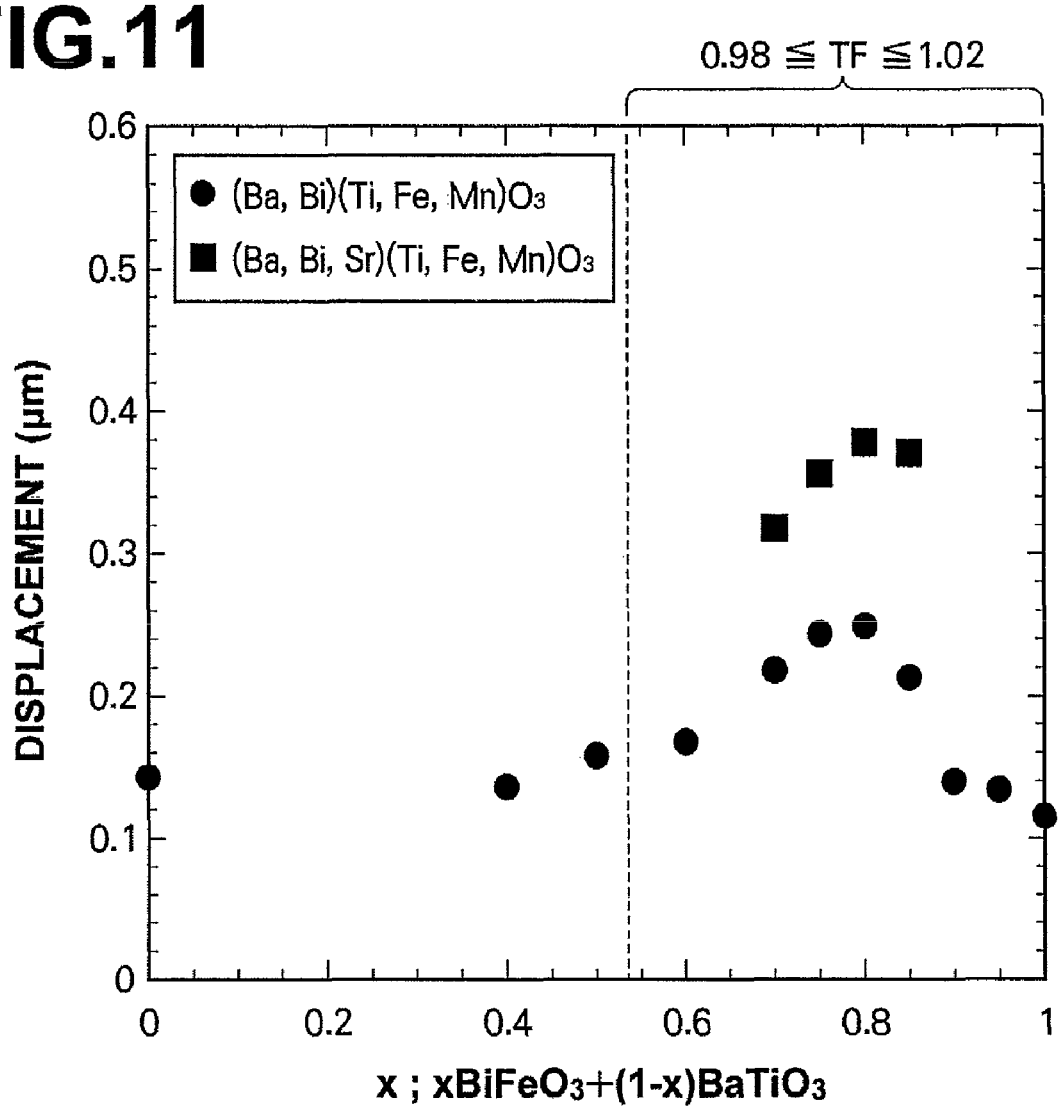
FIG. 11 is a graph indicating the relationships between the compositions and the piezoelectric performance of the (Ba, Bi)(Ti, Fe, Mn)O$_3$ films in the concrete example 1.
Figure 12:
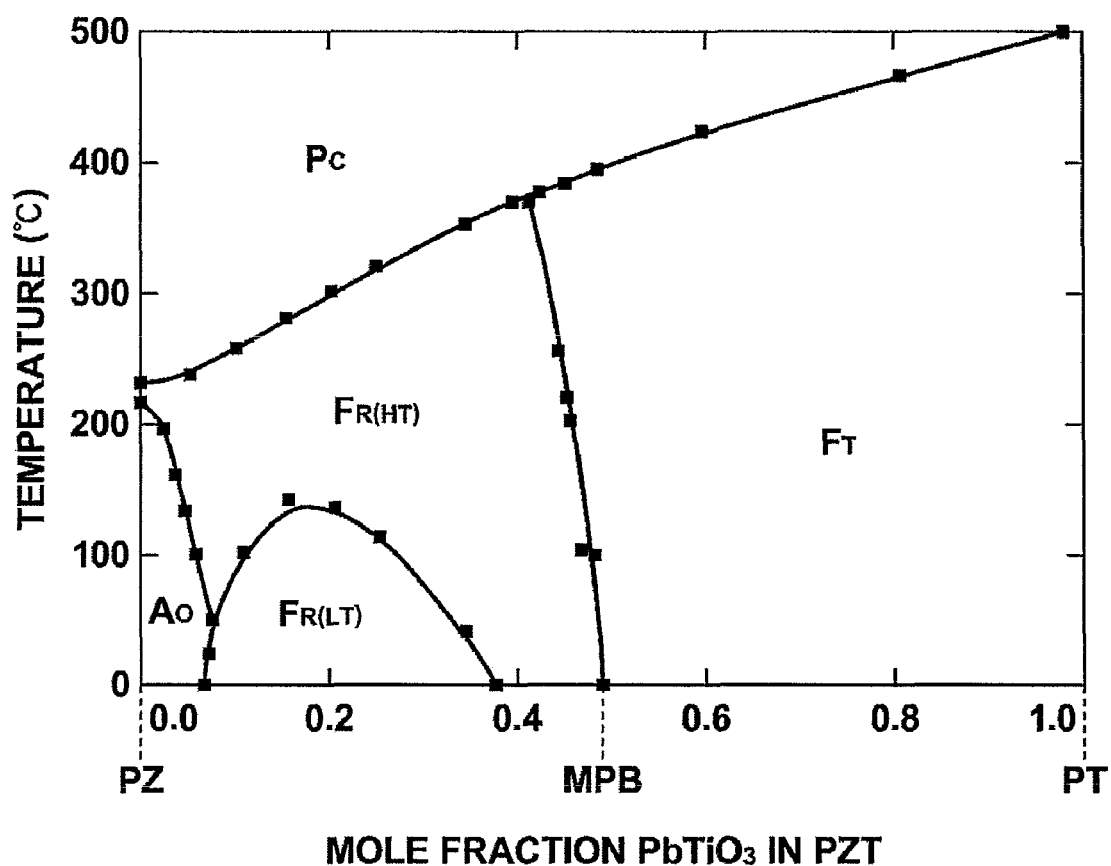
FIG. 12 is a phase diagram of PZT.

In FIG. 11, the measured values of the displacement of the tip of the cantilever are plotted versus the values of the fraction x of BaTiO$_3$ with the filled circles. As indicated in FIG. 11, the displacement varies with the fraction x of BaTiO$_3$ similarly to the permittivity. That is, the displacement increases in the range of the fraction x from 0.6 to 0.9, and has a local maximum in the range of the fraction x from 0.7 to 0.8.

It is known that the characteristics of the permittivity and the piezoelectric performance exhibit a local maximum at or near the MPB composition. Therefore, the results indicated in FIGS. 10 and 11 show that the MPB composition corresponds to the fraction x of BaTiO$_3$ approximately equal to 0.8.

Further, piezoelectric devices having the films of the aforementioned perovskite oxides (Ba, Bi, Sr)(Ti, Fe, Mn)$O_3$ as the piezoelectric films have also been produced as follows. In production of the piezoelectric devices having the (Ba, Bi, Sr)(Ti, Fe, Mn)$O_3$ films, the layers constituting the piezoelectric devices having the (Ba, Bi, Sr)(Ti, Fe, Mn)$O_3$ films have been formed in similar manners to the corresponding layers in the piezoelectric devices having the (Ba, Bi)(Ti, Fe, Mn)$O_3$ films except that the SrTiO$_3$ (having the tolerance factor TF of 1.002) has been added in formation of the (Ba, Bi, Sr)(Ti, Fe, Mn)$O_3$ films. However, only the (Ba, Bi, Sr)(Ti, Fe, Mn)$O_3$ films with the fractions x (0.7, 0.75, 0.8, and 0.85) of SrTiO$_3$, in the range which has been determined to be near the MPB on the basis of the measurement of the (Ba, Bi)(Ti, Fe, Mn)$O_3$ films, have been produced.

The target used in the formation of each of the (Ba, Bi, Sr)(Ti, Fe, Mn)$O_3$ films has been produced as follows.

A mixture of powers of BaTiO$_3$, Bi$_{1.1}$FeO$_3$, Mn$_2$O$_3$, and SrTiO$_3$ (manufactured by Toshima Manufacturing Co., Ltd.) in predetermined proportions have been produced by processing the mixture of the powers in a ball mill for 24 hours, shaped, and prebaked at 800° C. for 24 hours. Thereafter, the target has been produced by pulverizing and reshaping the shaped and prebaked mixture of the powers, and baking the prebaked and reshaped mixture of the powers at 950° C. for 24 hours. Since the saturated vapor pressure of Bi is high, and Bi is volatile, the powder of Bi1.1FeO3, which contains 10% excessive Bi, is used in order to supplement vapored portion of Bi.

After the formation of the (Ba, Bi, Sr)(Ti, Fe, Mn)$O_3$ films, the crystal structures of the (Ba, Bi, Sr)(Ti, Fe, Mn)$O_3$ films have been analyzed by XRD and RHEED. Thereafter, the upper electrodes have been formed on the (Ba, Bi, Sr)(Ti, Fe, Mn)$O_3$ films, and the piezoelectric performance of each of the piezoelectric devices having the (Ba, Bi, Sr)(Ti, Fe, Mn)$O_3$ films has also been evaluated by use of a cantilever.

The result of the XRD analysis shows that all the (Ba, Bi, Sr)(Ti, Fe, Mn)O$_3$ films have been confirmed to be a (001)-oriented, single-phase perovskite film. The XRD profile of the (Ba, Bi, Sr)(Ti, Fe, Mn)O$_3$ film with the fraction x of 0.8 as a representative of the (Ba, Bi, Sr)(Ti, Fe, Mn)O$_3$ films is indicated in FIG. 9 by the reference (B). Further, the (Ba, Bi, Sr)(Ti, Fe, Mn)O$_3$ films have also been analyzed by reciprocal lattice mapping and observation by a TEM, and confirmed to be an epitaxial film.

In FIG. 11, the measured values of the displacement of the tip of the cantilever produced with each of the piezoelectric devices having the (Ba, Bi, Sr)(Ti, Fe, Mn)O$_3$ films are also plotted versus the values of the fraction x of BaTiO$_3$ with the filled squares. As indicated in FIG. 11, at each value of the fraction x of BaTiO$_3$, the (Ba, Bi, Sr)(Ti, Fe, Mn)O$_3$ film exhibits greater displacement than the (Ba, Bi)(Ti, Fe, Mn)O$_3$ film. For example, at the fraction x of 0.8, the displacement of the (Ba, Bi, Sr)(Ti, Fe, Mn)O$_3$ film is 0.38 micrometers, while the displacement of the (Ba, Bi)(Ti, Fe, Mn)O$_3$ film is 0.25 micrometers. That is, the displacement of the (Ba, Bi, Sr)(Ti, Fe, Mn)O$_3$ film is approximately 1.5 times the displacement of the (Ba, Bi)(Ti, Fe, Mn)O$_3$ film.

9. Industrial Usability

The piezoelectric devices according to the present invention can be preferably used in piezoelectric actuators, ferroelectric memories (FRAMs), and the like, where the piezoelectric actuators may be mounted in the inkjet recording heads, the magnetic recording-and-reproduction heads, MEMS (micro electromechanical systems) devices, micropumps, ultrasonic probes, and the like.

What is claimed is:

1. A piezoelectric oxide having a composition expressed by a compositional formula, (Ba, Bi, A)(Ti, Fe, M)O$_3$, where each of A and M represents one or more metal elements other than Pb; Ba, Bi, and A are A-site elements, Ti, Fe, and M are B-site elements, Ba, Bi, Ti, Fe and O respectively represent barium, bismuth, titanium, iron, and oxygen, the one or more B-site elements represented by M are elements other than Ti and Fe when the one or more A-site elements represented by A are Ba and/or Bi, the one or more A-site elements represented by A are elements other than Ba and Bi when the one or more B-site elements represented by M are Ti and/or Fe, and the ratio of each of the total molar amount of the A-site elements and the total molar amount of the B-site elements to the molar amount of oxygen may deviate from 1:3 within a range in which the composition expressed by the compositional formula (Ba, Bi, A)(Ti, Fe, M)O$_3$ can form a perovskite structure;

the composition of the compound (Ba, Bi, A)(Ti, Fe, M)O$_3$ is determined so as to satisfy the conditions (1) and (2), 0.98 ≤ TF(P) ≤ 1.02, and    (1)

TF(BiFeO$_3$) < TF(AMO$_3$) < TF(BaTiO$_3$),    (2)

where TF(P) is a tolerance factor of the piezoelectric oxide expressed by the compositional formula (Ba, Bi, A)(Ti, Fe, M)O$_3$, TF(BaTiO$_3$) is a tolerance factor of a compound expressed by a compositional formula BaTiO$_3$, TF(BiFeO$_3$) is a tolerance factor of a compound expressed by a compositional formula BiFeO$_3$, and TF(AMO$_3$) is a tolerance factor of a compound expressed by a compositional formula AMO$_3$.

2. A piezoelectric oxide according to claim 1, wherein said composition of the perovskite oxide further satisfies the condition (3), 0.98 ≤ TF(AMO$_3$) ≤ 1.02    (3).

3. A piezoelectric oxide according to claim 1, wherein said one or A-site metal elements represented by A include Sr.

4. A piezoelectric oxide according to claim 1, wherein said one or more A-site elements represented by A include at least one of Bi and Ba.

5. A piezoelectric oxide according to claim 1, wherein said one or more B-site elements represented by M include at least one of Ti and Fe.

6. A piezoelectric oxide according to claim 1, containing a first component BaTiO$_3$, a second component BiFeO$_3$, and a third component AMO$_3$, where the ratio of each of the molar amount of an A-site element and the molar amount of a B-site element to the molar amount of oxygen atoms in each of the first component BaTiO$_3$, the second component BiFeO$_3$, and the third component AMO$_3$ may deviate from 1:3 within a range in which said each of the first component BaTiO$_3$, the second component BiFeO$_3$, and the third component AMO$_3$ can form a perovskite structure.

7. A piezoelectric oxide according to claim 6, wherein said first component, said second component, and said third component each form a crystal structure corresponding to a different crystal system.

8. A piezoelectric oxide according to claim 7, wherein said first component forms a first crystal structure of a tetragonal system, said second component forms a second crystal structure of a rhombohedral system, and said third component forms a third crystal structure of one of cubic and pseudocubic systems.

9. A piezoelectric oxide according to claim 1, having,
a composition at or near a morphotropic phase boundary, and
a mixed-crystal structure composed of at least two first crystal phases which are ones of tetragonal, orthorhombic, and rhombohedral phases, and at least one second crystal phase which is at least one of cubic and pseudocubic phases.

10. A piezoelectric oxide according to claim 9, wherein said mixed-crystal structure is composed of the tetragonal phase, the rhombohedral phase, and one of the cubic and pseudocubic phases.

11. A piezoelectric oxide according to claim 10, having a structure which exhibits a high-resolution X-ray diffraction profile including a first diffraction peak corresponding to a tetragonal phase, a second diffraction peak corresponding to a rhombohedral phase, and a third diffraction peak corresponding to a phase different from the tetragonal phase and the rhombohedral phase.

12. A ferroelectric compound containing said perovskite oxide according to claim 1.

13. A piezoelectric body containing said perovskite oxide according to claim 1.

14. A piezoelectric body according to claim 13, having a form of a film.

15. A piezoelectric body according to claim 14, being produced by epitaxial growth.

16. A piezoelectric body according to claim 13, containing a ferroelectric phase which has crystal orientation.

17. A piezoelectric body according to claim 16, containing at least one ferroelectric phase, where each of the at least one ferroelectric phase has a spontaneous polarization axis along a first direction and crystal orientation along a second direction different from the first direction.

18. A piezoelectric body according to claim 17, wherein each of said at least one ferroelectric phase is at least one of a rhombohedral phase having crystal orientation along approximately a <100> direction, a rhombohedral phase having crystal orientation along approximately a <110> direction, a tetragonal phase having crystal orientation along approximately a <110> direction, a tetragonal phase having crystal orientation along approximately a <111> direction, an orthorhombic phase having crystal orientation along approximately a <100> direction, and an orthorhombic phase having crystal orientation along approximately a <111> direction.

19. A piezoelectric body according to claim 18, wherein at least a portion of said each of the at least one ferroelectric phase transitions to a ferroelectric phase corresponding to a crystal system different from a crystal system corresponding to said each of the at least one ferroelectric phase, when an electric field is applied to said piezoelectric body along a direction different from said first direction.

20. A piezoelectric device comprising:
   said piezoelectric body according to claim 13; and
   electrodes arranged to apply an electric field to the piezoelectric body.

21. A piezoelectric device comprising:
said piezoelectric body according to claim 17; and
electrodes arranged to apply an electric field to the piezoelectric body along a direction different from said first direction.

22. A liquid discharge device comprising:
said piezoelectric device according to claim 20; and
a discharge member being arranged adjacent to the piezoelectric device, and including,
   a liquid-reserve chamber which reserves liquid, and
   a liquid-discharge outlet arranged to externally discharge said liquid in response to application of an electric field to said piezoelectric body in the piezoelectric device.

* * * * *